United States Patent
Zhou et al.

(10) Patent No.: US 11,722,265 B2
(45) Date of Patent: Aug. 8, 2023

(54) FEEDBACK DESIGN FOR NETWORK CODING TERMINATION IN BROADCASTING

(71) Applicant: QUALCOMM Incorporated, San Diego, CA (US)

(72) Inventors: Shanyu Zhou, San Diego, CA (US); Jelena Damnjanovic, Del Mar, CA (US); Tao Luo, San Diego, CA (US); Mahmoud Taherzadeh Boroujeni, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 98 days.

(21) Appl. No.: 17/375,126

(22) Filed: Jul. 14, 2021

(65) Prior Publication Data
US 2022/0021490 A1   Jan. 20, 2022

Related U.S. Application Data

(60) Provisional application No. 63/053,084, filed on Jul. 17, 2020.

(51) Int. Cl.
*H04W 72/04* (2023.01)
*H04L 1/1867* (2023.01)
(Continued)

(52) U.S. Cl.
CPC ............ *H04L 1/1896* (2013.01); *H04L 1/005* (2013.01); *H04L 1/1819* (2013.01); *H04W 28/04* (2013.01); *H04W 80/02* (2013.01)

(58) Field of Classification Search
CPC ..... H04L 1/1896; H04L 1/005; H04L 1/1819; H04L 1/1607; H04L 2001/0097;
(Continued)

(56) References Cited

U.S. PATENT DOCUMENTS

| | | | |
|---|---|---|---|
| 9,088,888 B2 * | 7/2015 | Duan | H04W 12/02 |
| 2007/0223620 A1 * | 9/2007 | Kalhan | H04L 1/1867 |
| | | | 375/295 |

(Continued)

FOREIGN PATENT DOCUMENTS

WO   WO-2011113200 A1 *   9/2011   ........... H04L 1/1887

OTHER PUBLICATIONS

Dai J., et al., "LT Codes with Limited Feedback", 2014 IEEE International Conference on Computer and Information Technology, IEEE, Sep. 11, 2014 (Sep. 11, 2014), pp. 669-673, XP032702894, DOI: 10.1109/CIT.2014.73, [retrieved on Dec. 12, 2014] Abstract, Section III.

(Continued)

*Primary Examiner* — Mahbubul Bar Chowdhury
(74) *Attorney, Agent, or Firm* — Holland & Hart LLP

(57) ABSTRACT

Methods, systems, and devices for wireless communications are described. A network node may identify a set of packets for broadcasting to a set of user equipment (UEs) and may transmit a set of encoded packets based on the set of packets. The network node may receive feedback from one or more of the UEs, and the feedback may indicate a number of successfully received packets of the set of encoded packets at each of the one or more UEs. Based on the feedback, the network node may transmit a second set of encoded packets to the set of UEs if the number of successfully received packets for at least one UE fails to satisfy a decodability threshold. The transmitter may continue to transmit sets of encoded packets until the feedback indicates that each UE has received a number of packets that satisfies the decodability threshold.

28 Claims, 21 Drawing Sheets

(51) Int. Cl.
*H04L 1/1812* (2023.01)
*H04W 80/02* (2009.01)
*H04L 1/00* (2006.01)
*H04W 28/04* (2009.01)

(58) Field of Classification Search
CPC ....... H04L 1/0076; H04L 1/0023; H04L 1/18; H04L 2001/0093; H04W 28/04; H04W 80/02; H04W 72/121; H03M 13/3761
See application file for complete search history.

(56) References Cited

U.S. PATENT DOCUMENTS

| | | | | |
|---|---|---|---|---|
| 2008/0043834 | A1* | 2/2008 | Lesser | H04L 67/02 375/240 |
| 2008/0123579 | A1* | 5/2008 | Kozat | H04L 1/1887 370/312 |
| 2008/0152061 | A1* | 6/2008 | Kozat | H04L 1/0009 375/240.24 |
| 2010/0054164 | A1* | 3/2010 | Lucani | H04L 1/0041 370/468 |
| 2011/0170457 | A1* | 7/2011 | Uppal | H04L 1/0009 370/277 |
| 2011/0211468 | A1* | 9/2011 | Zhang | H04L 1/0002 370/252 |
| 2011/0246848 | A1* | 10/2011 | Yue | H03M 13/3723 714/751 |
| 2011/0264977 | A1* | 10/2011 | Chen | H04L 1/1854 714/749 |
| 2012/0210190 | A1* | 8/2012 | Luby | H04L 1/0057 714/755 |
| 2019/0356425 | A1* | 11/2019 | Dudda | H04L 1/1812 |
| 2020/0103894 | A1* | 4/2020 | Cella | H04L 1/0002 |
| 2020/0259600 | A1* | 8/2020 | Cao | H04L 1/1819 |
| 2021/0218498 | A1* | 7/2021 | Effros | H03M 13/63 |
| 2021/0337509 | A1* | 10/2021 | Selvanesan | H04L 1/08 |
| 2021/0400631 | A1 | 12/2021 | Zhou et al. | |
| 2022/0014318 | A1 | 1/2022 | Zhou et al. | |
| 2022/0085831 | A1* | 3/2022 | Liu | H04W 72/0406 |

OTHER PUBLICATIONS

Huawei., et al., "Sidelink Support & Enhancements for NR", 3GPP TSG-RAN WG Meeting #86, 3GPP Draft, R1-167207, 3rd Generation Partnership Project (3GPP), Mobile Competence Centre, 650, Route Des Lucioles, F-06921 Sophia-Anti Polls Cedex, France, vol. RAN WG1, No. Gothenburg, Sweden, Aug. 22, 2016-Aug. 26, 2016, Aug. 21, 2016, (Aug. 21, 2016), XP051142227, 7 Pages, Retrieved from the Internet: URL: http://www.3gpp.org/ftp/tsg_ran/WG1_RL1/TSGR1_86/Docs/ [retrieved on Aug. 12, 2016], Section 2, figure 1.

International Search Report and Written Opinion—PCT/US2021/041825—ISA/EPO—dated Nov. 2, 2021.

Yu J., et al., "Novel LT Coding Scheme with Limited Feedback in Broadcast Systems", Wireless Communications & Signal Processing (WCSP), 2012 International Conference on, IEEE, Oct. 25, 2012 (Oct. 25, 2012), 5 Pages, XP032428400, DOI: 10.1109/WCSP.2012.6542953, ISBN: 978-1-4673-5830-9, Abstract, Section III, Figure 1.

* cited by examiner

FEEDBACK DESIGN FOR NETWORK CODING TERMINATION IN BROADCASTING

CROSS REFERENCE

The present application for patent claims the benefit of U.S. Provisional Patent Application No. 63/053,084 by Zhou et al., entitled "FEEDBACK DESIGN FOR NETWORK CODING TERMINATION IN BROADCASTING," filed Jul. 17, 2020, assigned to the assignee hereof, and expressly incorporated by reference herein.

FIELD OF TECHNOLOGY

The following relates generally to wireless communications and more specifically to feedback design for network coding termination in broadcasting.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform spread orthogonal frequency division multiplexing (DFT-S-OFDM).

A wireless multiple-access communications system may include one or more base stations or one or more network access nodes, each simultaneously supporting communication for multiple communication devices, which may be otherwise known as user equipment (UE). Wireless communications systems may support broadcasting of packets to multiple UEs. The transmitter (e.g., a network node, a base station, etc.) may broadcast multiple packets to multiple receivers (e.g., UEs). In some cases, the transmitter may repeatedly broadcast the multiple packets blindly without the transmitter knowing which packets have been decoded or received by the receivers.

SUMMARY

The described techniques relate to improved methods, systems, devices, and apparatuses that support feedback design for network coding termination in broadcasting. Generally, the described techniques provide for transmitting network encoded packets using a design based on feedback from different receivers indicating how many of the network encoded packets are successfully received by the different receivers. For example, a network device (e.g., a transmitter, a base station, etc.) may transmit a first set of encoded packets to multiple receiving devices (e.g., multiple user equipment (UEs)) and receive feedback from one or more of the multiple receiving devices indicating a number of successfully received packets of the first set of encoded packets at each of the one or more receivers. In some implementations, the feedback may indicate a number of missed packets of the first set of encoded packets at each of the one or more receivers (e.g., the number of successfully received packets may be indicated based on the number of missed packets). Additionally or alternatively, the feedback may include separate acknowledgment feedback indications for each packet in the first set of encoded packets. Subsequently, the network device may determine that the number of successfully received packets of the first set of encoded packets fails to satisfy a decodability threshold value (e.g., decodable threshold) for at least one of the one or more receivers and may transmit a second set of encoded packets to the multiple receiving devices. The network device may continue to transmit additional sets of encoded packets to the multiple receiving devices (e.g., via broadcast or unicast transmissions) until each of the one or more receiving devices that are reporting feedback have successfully received a number of encoded packets to satisfy the decodability threshold value (e.g., the number of received encoded packets for each receiving device is larger than the decodability threshold value).

A method of wireless communications at a network node is described. The method may include identifying, at the network node, a set of packets for broadcast to a set of UEs, transmitting, to the set of UEs, a first set of network encoded packets based on the set of packets; receiving feedback from each of one or more of the set of UEs, the feedback indicating a number of successfully received packets of the first set of network encoded packets at each of the one or more UEs; determining that the number of successfully received packets of the first set of network encoded packets fails to satisfy a decodability threshold value for at least one of the one or more UEs; and transmitting, based on the determining, a second set of network encoded packets selected from the set of packets.

An apparatus for wireless communications at a network node is described. The apparatus may include a processor, memory coupled with the processor, and instructions stored in the memory. The instructions may be executable by the processor to cause the apparatus to identify, at the network node, a set of packets for broadcast to a set of UEs; to transmit, to the set of UEs, a first set of network encoded packets based on the set of packets; to receive feedback from each of one or more of the set of UEs, the feedback indicating a number of successfully received packets of the first set of network encoded packets at each of the one or more UEs; to determine that the number of successfully received packets of the first set of network encoded packets fails to satisfy a decodability threshold value for at least one of the one or more UEs; and to transmit, based on the determining, a second set of network encoded packets selected from the set of packets.

Another apparatus for wireless communications at a network node is described. The apparatus may include means for identifying, at the network node, a set of packets for broadcast to a set of UEs; means for transmitting, to the set of UEs, a first set of network encoded packets based on the set of packets; means for receiving feedback from each of one or more of the set of UEs, the feedback indicating a number of successfully received packets of the first set of network encoded packets at each of the one or more UEs; means for determining that the number of successfully received packets of the first set of network encoded packets fails to satisfy a decodability threshold value for at least one of the one or more UEs; and means for transmitting, based on the determining, a second set of network encoded packets selected from the set of packets.

A non-transitory computer-readable medium storing code for wireless communications at a network node is described. The code may include instructions executable by a processor to identify, at the network node, a set of packets for broadcast to a set of UEs; to transmit, to the set of UEs, a first set of network encoded packets based on the set of packets; to receive feedback from each of one or more of the set of UEs, the feedback indicating a number of successfully received packets of the first set of network encoded packets at each of the one or more UEs; to determine that the number of successfully received packets of the first set of network encoded packets fails to satisfy a decodability threshold value for at least one of the one or more UEs; and to transmit, based on the determining, a second set of network encoded packets selected from the set of packets.

In some examples of the method, apparatuses, and non-transitory computer-readable medium described herein, receiving the feedback from each of the one or more of the set of UEs may include operations, features, means, or instructions for receiving, from each of the one or more of the set of UEs, a number of missed packets of the first set of network encoded packets, where the number of successfully received packets may be indicated based on the number of missed packets.

In some examples of the method, apparatuses, and non-transitory computer-readable medium described herein, receiving the feedback from each of the one or more of the set of UEs may include operations, features, means, or instructions for receiving, from each of the one or more of the set of UEs, separate acknowledgment feedback indications for each packet in the first set of network encoded packets, where the number of successfully received packets may be indicated based on the separate acknowledgment feedback indications.

In some examples of the method, apparatuses, and non-transitory computer-readable medium described herein, transmitting the second set of network encoded packets may include operations, features, means, or instructions for transmitting the second set of network encoded packets to a subset of the set of UEs via respective unicast messages to each UE in the subset, where the subset of the set of UEs may be determined based on the number of successfully received packets failing to satisfy the decodability threshold value for each UE in the subset.

Some examples of the method, apparatuses, and non-transitory computer-readable medium described herein may further include operations, features, means, or instructions for determining a number of UEs of the one or more of the set of UEs may have successfully received the set of packets based on the feedback from each of the one or more of the set of UEs, where the second set of network encoded packets may be transmitted via the unicast messages based on the number of UEs being less than a threshold.

In some examples of the method, apparatuses, and non-transitory computer-readable medium described herein, transmitting the second set of network encoded packets may include operations, features, means, or instructions for transmitting the second set of network encoded packets to the set of UEs via a broadcast message.

Some examples of the method, apparatuses, and non-transitory computer-readable medium described herein may further include operations, features, means, or instructions for storing the number of successfully received packets for each of the one or more UEs, where the determining the number of successfully received packets fails to satisfy the decodability threshold value may be based on the storing the number of successfully received packets.

Some examples of the method, apparatuses, and non-transitory computer-readable medium described herein may further include operations, features, means, or instructions for transmitting, to the set of UEs, one or more sets of network coding parameters to enable the set of UEs to decode a set of network encoded packets for the set of packets.

In some examples of the method, apparatuses, and non-transitory computer-readable medium described herein, the one or more sets of network coding parameters each may include network coding algorithms, an encoding function, an encoding matrix, a maximum number of decoding iterations, the decodability threshold value, or a combination thereof.

In some examples of the method, apparatuses, and non-transitory computer-readable medium described herein, transmitting the one or more sets of network coding parameters may include operations, features, means, or instructions for transmitting the one or more sets of network coding parameters to the set of UEs via a medium access control (MAC) control element (CE), downlink control information (DCI), radio resource control (RRC) signaling, or a combination thereof.

Some examples of the method, apparatuses, and non-transitory computer-readable medium described herein may further include operations, features, means, or instructions for determining at least one UE of the set of UEs is unable to recover the set of packets using a first set of network coding parameters of the one or more sets of network coding parameters; and transmitting, to the at least one UE, an additional set of network coding parameters different than the first set of network coding parameters for the at least one UE to decode the set of network encoded packets to recover the set of packets.

Some examples of the method, apparatuses, and non-transitory computer-readable medium described herein may further include operations, features, means, or instructions for receiving, from the at least one UE, a request for a different set of network coding parameters than the first set of network coding parameters, where the determining the at least one UE is unable to recover the set of packets using the first set of network coding parameters may be based on the request.

In some examples of the method, apparatuses, and non-transitory computer-readable medium described herein, the additional set of network coding parameters may be a second set of network coding parameters from the one or more sets of network coding parameters or a separate set of network coding parameters than the one or more sets of network coding parameters.

In some examples of the method, apparatuses, and non-transitory computer-readable medium described herein, receiving the feedback may include operations, features, means, or instructions for receiving the feedback from each of one or more of the set of UEs via a radio link control (RLC) status report, a MAC hybrid automatic repeat request (HARQ) acknowledgment message, or a combination thereof.

A method of wireless communications at a UE is described. The method may include receiving, from a network node, a first set of network encoded packets based on a set of packets; attempting to decode the first set of network encoded packets; and transmitting, to the network node, feedback indicating a number of successfully received packets of the first set of network encoded packets resulting from the attempt to decode the first set of network encoded packets.

An apparatus for wireless communications at a UE is described. The apparatus may include a processor, memory coupled with the processor, and instructions stored in the memory. The instructions may be executable by the processor to cause the apparatus to receive, from a network node, a first set of network encoded packets based on a set of packets; to attempt to decode the first set of network encoded packets; and to transmit, to the network node, feedback indicating a number of successfully received packets of the first set of network encoded packets resulting from the attempt to decode the first set of network encoded packets.

Another apparatus for wireless communications at a UE is described. The apparatus may include means for receiving, from a network node, a first set of network encoded packets based on a set of packets; means for attempting to decode the first set of network encoded packets; and means for transmitting, to the network node, feedback indicating a number of successfully received packets of the first set of network encoded packets resulting from the attempt to decode the first set of network encoded packets.

A non-transitory computer-readable medium storing code for wireless communications at a UE is described. The code may include instructions executable by a processor to receive, from a network node, a first set of network encoded packets based on a set of packets; to attempt to decode the first set of network encoded packets; and to transmit, to the network node, feedback indicating a number of successfully received packets of the first set of network encoded packets resulting from the attempt to decode the first set of network encoded packets.

Some examples of the method, apparatuses, and non-transitory computer-readable medium described herein may further include operations, features, means, or instructions for receiving, from the network node, a second set of network encoded packets based on the set of packets, where the second set of network encoded packets may be received based on the number of successfully received packets of the first set of network encoded packets failing to satisfy a decodability threshold value.

In some examples of the method, apparatuses, and non-transitory computer-readable medium described herein, receiving the second set of network encoded packets may include operations, features, means, or instructions for receiving the second set of network encoded packets via a broadcast message or a unicast message from the network node.

In some examples of the method, apparatuses, and non-transitory computer-readable medium described herein, transmitting the feedback indicating the number of successfully received packets may include operations, features, means, or instructions for transmitting, to the network node, a number of missed packets of the first set of network encoded packets, where the number of successfully received packets may be indicated based on the number of missed packets.

In some examples of the method, apparatuses, and non-transitory computer-readable medium described herein, transmitting the feedback indicating the number of successfully received packets may include operations, features, means, or instructions for transmitting, to the network node, separate acknowledgment feedback indications for each packet in the first set of network encoded packets, where the number of successfully received packets may be indicated based on the separate acknowledgment feedback indications.

Some examples of the method, apparatuses, and non-transitory computer-readable medium described herein may further include operations, features, means, or instructions for receiving, from the network node, one or more sets of network coding parameters to enable a set of UEs to decode a set of network encoded packets for the set of packets, the set of UEs including the UE.

In some examples of the method, apparatuses, and non-transitory computer-readable medium described herein, the one or more sets of network coding parameters each may include network coding algorithms, an encoding function, an encoding matrix, a maximum number of decoding iterations, the decodability threshold value, or a combination thereof.

Some examples of the method, apparatuses, and non-transitory computer-readable medium described herein may further include operations, features, means, or instructions for determining to use a first set of network coding parameters from the one or more sets of network coding parameters for the attempting to decode the first set of network encoded packets.

Some examples of the method, apparatuses, and non-transitory computer-readable medium described herein may further include operations, features, means, or instructions for determining the first set of network coding parameters is insufficient for decoding the first set of network encoded packets to recover the set of packets; transmitting, to the network node, a request for a different set of network coding parameters based on the determining the first set of network coding parameters may be insufficient; and receiving, from the network node, an additional set of network coding parameters for decoding a subsequent transmission of a set of encoded packets for the set of packets.

In some examples of the method, apparatuses, and non-transitory computer-readable medium described herein, the additional set of network coding parameters may be a second set of network coding parameters from the one or more sets of network coding parameters or a separate set of network coding parameters than the one or more sets of network coding parameters.

In some examples of the method, apparatuses, and non-transitory computer-readable medium described herein, transmitting the feedback may include operations, features, means, or instructions for transmitting the feedback to the network node via an RLC status report, a MAC HARQ acknowledgment message, or a combination thereof.

DETAILED DESCRIPTION

Figure 1:
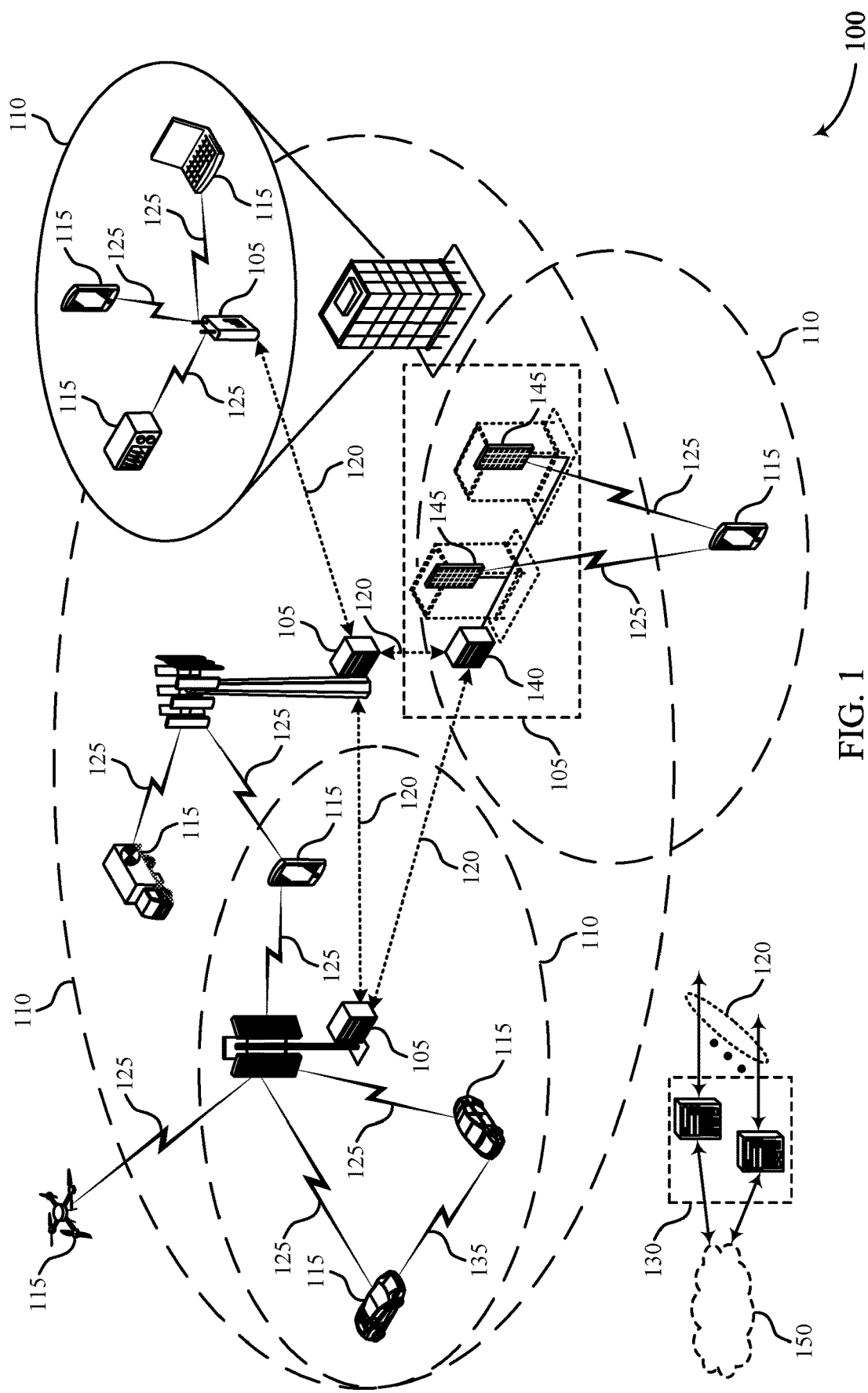
FIG. 1 illustrates an example of a system for wireless communications that supports feedback design for network coding termination in broadcasting in accordance with aspects of the present disclosure.

Wireless communications systems may support broadcasting of network encoded packets to a set of multiple user equipment (UEs). For example, a transmitter (e.g., a network node, a base station, etc.) may broadcast multiple packets to multiple receivers (e.g., multiple UEs). In some cases, transmitters may repeatedly broadcast multiple packets to multiple receivers blindly without the transmitters knowing which network encoded packets have been successfully decoded or received by the receivers. That is, if the broadcasting system does not utilize feedback associated with packets, the transmitters may continue to transmit packets blindly without any indication of packets that have actually been received and decoded by the UEs. Thus, the transmitter may rebroadcast packets in a wasteful manner because some packets may have been received and decoded by all UEs. Thus, the lack of feedback may result in a waste of resources, unnecessary duplication of packets, and low efficiency. Additionally or alternatively, the UEs may report feedback when attempting to receive and decode the network encoded packets to indicate which packets have been successfully received and decoded, but the feedback may include additional information (e.g., channel quality estimation, signal measurements, etc.) that may unnecessarily complicate the feedback. For example, the transmitter may solely use a number of received packets at each UE (e.g., receiver) to determine when to terminate encoding of the packets, so the additional information may not be needed by the transmitter for this determination, thereby resulting in unnecessary signaling overhead for the receivers to transmit such additional information when transmitting feedback for decoding the network encoded packets.

Techniques described herein may leverage feedback for broadcasted packets to determine a number of successfully received packets of network encoded packets by each receiver of the broadcasted packets. For example, when a network device (e.g., a transmitter) broadcasts a set of packets using network encoded packets to a set of UEs (e.g., receivers), each of the set of UEs (e.g., or a subset of the UEs) may transmit feedback to the network device based on attempting to receive the network encoded packets, where the feedback indicates a number of successfully received packets of the network encoded packets. In some implementations, each UE may indicate the number of successfully received packets by transmitting a number of missed packets from the network encoded packets. Additionally or alternatively, each UE may indicate the number of successfully received packets by transmitting individual acknowledgment feedback indications for each packet of the network encoded packets (e.g., a '0' to indicate a corresponding packet was not received and a '1' to indicate a corresponding packet is successfully received).

Subsequently, the transmitter may use this feedback to determine whether at least one UE had a number of successfully received packets that failed to satisfy a decodability threshold (e.g., the decodability threshold may indicate a number of successfully received packets that can indicate successful decoding and reception of a message carried by the set of packets). If at least one UE fails to satisfy the decodability threshold with a corresponding number of successfully received packets (e.g., the number of successfully received packets is less than the decodability threshold for at least one UE), the transmitter may transmit the set of packets using a second set of network encoded packets to the set of UEs (e.g., via a broadcast message to the entire set of UEs or via unicast messages to those UEs that fail to satisfy the decodability threshold with their respective number of successfully received packets). Each of the UEs 115 may again respond with respective feedbacks indicating the number of successfully received packets for the second set of network encoded packets. The network node may continue to transmit additional sets of network encoded packets until each UE 115 of the set of UEs 115 satisfies the decodability threshold. Once each UE 115 satisfies the decodability threshold, the network node may terminate coding of the set of packets and may stop broadcasting or transmitting sets of encoded packets for the set of packets.

Particular aspects of the subject matter described herein may be implemented to realize one or more advantages. The described techniques may support improvements in the packet broadcasting framework, decreasing signaling overhead, and improving reliability, among other advantages. As such, supported techniques may include improved network operations and, in some examples, may promote network efficiencies, among other benefits.

Aspects of the disclosure are initially described in the context of wireless communications systems. Additionally, aspects of the disclosure are illustrated through an additional wireless communications system, a feedback configuration, a process flow diagram, an encoding process, a decoding process, and an additional process flow. Aspects of the disclosure are further illustrated by and described with reference to apparatus diagrams, system diagrams, and flowcharts that relate to feedback design for network coding termination in broadcasting.

FIG. 1 illustrates an example of a wireless communications system 100 that supports feedback design for network coding termination in broadcasting in accordance with aspects of the present disclosure. The wireless communications system 100 may include one or more base stations 105, one or more UEs 115, and a core network 130. In some examples, the wireless communications system 100 may be a Long Term Evolution (LTE) network, an LTE-Advanced (LTE-A) network, an LTE-A Pro network, or a New Radio (NR) network. In some examples, the wireless communications system 100 may support enhanced broadband communications, ultra-reliable (e.g., mission critical) communications, low latency communications, communications with low-cost and low-complexity devices, or any combination thereof.

The base stations 105 may be dispersed throughout a geographic area to form the wireless communications system 100 and may be devices in different forms or having different capabilities. The base stations 105 and the UEs 115 may wirelessly communicate via one or more communication links 125. Each base station 105 may provide a coverage area 110 over which the UEs 115 and the base station 105 may establish one or more communication links 125. The coverage area 110 may be an example of a geographic area over which a base station 105 and a UE 115 may support the communication of signals according to one or more radio access technologies.

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be able to communicate with various types of devices, such as other UEs 115, the base stations 105, or network equipment (e.g., core network nodes, relay devices, integrated access and backhaul (IAB) nodes, or other network equipment), as shown in FIG. 1.

The base stations 105 may communicate with the core network 130, or with one another, or both. For example, the base stations 105 may interface with the core network 130 through one or more backhaul links 120 (e.g., via an S1, N2, N3, or other interface). The base stations 105 may communicate with one another over the backhaul links 120 (e.g., via an X2, Xn, or other interface) either directly (e.g., directly between base stations 105), or indirectly (e.g., via core network 130), or both. In some examples, the backhaul links 120 may be or include one or more wireless links.

One or more of the base stations 105 described herein may include or may be referred to by a person having ordinary skill in the art as a base transceiver station, a radio base station, an access point, a radio transceiver, a NodeB, an eNodeB (eNB), a next-generation NodeB or a giga-NodeB (either of which may be referred to as a gNB), a Home NodeB, a Home eNodeB, or other suitable terminology.

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes act as relays as well as the base stations 105 and the network equipment including macro eNBs or gNBs, small cell eNBs or gNBs, or relay base stations, among other examples, as shown in FIG. 1.

The UEs 115 and the base stations 105 may wirelessly communicate with one another via one or more communication links 125 over one or more carriers. The term "carrier" may refer to a set of radio frequency spectrum resources having a defined physical layer structure for supporting the communication links 125. For example, a carrier used for a communication link 125 may include a portion of a radio frequency spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers.

In some examples (e.g., in a carrier aggregation configuration), a carrier may also have acquisition signaling or control signaling that coordinates operations for other carriers. A carrier may be associated with a frequency channel (e.g., an evolved universal mobile telecommunication system terrestrial radio access (E-UTRA) absolute radio frequency channel number (EARFCN)) and may be positioned according to a channel raster for discovery by the UEs 115. A carrier may be operated in a standalone mode where initial acquisition and connection may be conducted by the UEs 115 via the carrier, or the carrier may be operated in a non-standalone mode where a connection is anchored using a different carrier (e.g., of the same or a different radio access technology).

The communication links 125 shown in the wireless communications system 100 may include uplink transmissions from a UE 115 to a base station 105, or downlink transmissions from a base station 105 to a UE 115. Carriers may carry downlink or uplink communications (e.g., in an FDD mode) or may be configured to carry downlink and uplink communications (e.g., in a TDD mode).

A carrier may be associated with a particular bandwidth of the radio frequency spectrum, and in some examples the carrier bandwidth may be referred to as a "system bandwidth" of the carrier or the wireless communications system 100. For example, the carrier bandwidth may be one of a number of determined bandwidths for carriers of a particular radio access technology (e.g., 1.4, 3, 5, 10, 15, 20, 40, or 80 megahertz (MHz)). Devices of the wireless communications system 100 (e.g., the base stations 105, the UEs 115, or both) may have hardware configurations that support communications over a particular carrier bandwidth or may be configurable to support communications over one of a set of carrier bandwidths. In some examples, the wireless communications system 100 may include base stations 105 or UEs 115 that support simultaneous communications via carriers associated with multiple carrier bandwidths. In some examples, each served UE 115 may be configured for operating over portions (e.g., a sub-band, a BWP) or all of a carrier bandwidth.

Signal waveforms transmitted over a carrier may be made up of multiple subcarriers (e.g., using multi-carrier modulation (MCM) techniques such as orthogonal frequency division multiplexing (OFDM) or discrete Fourier transform spread OFDM (DFT-S-OFDM)). In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme, the coding rate of the modulation scheme, or both). Thus, the more resource elements that a UE 115 receives and the higher the order of the modulation scheme, the higher the data rate may be for the UE 115. A wireless communications resource may refer to a combination of a radio frequency spectrum resource, a time resource, and a spatial resource (e.g., spatial layers or beams), and the use of multiple spatial layers may further increase the data rate or data integrity for communications with a UE 115.

One or more numerologies for a carrier may be supported, where a numerology may include a subcarrier spacing ($\Delta f$) and a cyclic prefix. A carrier may be divided into one or more BWPs having the same or different numerologies. In some examples, a UE 115 may be configured with multiple BWPs. In some examples, a single BWP for a carrier may be active at a given time and communications for the UE 115 may be restricted to one or more active BWPs.

The time intervals for the base stations 105 or the UEs 115 may be expressed in multiples of a basic time unit which may, for example, refer to a sampling period of $T_s=1/(\Delta f_{max} \cdot N_f)$ seconds, where $\Delta f_{max}$ may represent the maximum supported subcarrier spacing, and $N_f$ may represent the maximum supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively numbered subframes or slots, and each subframe or slot may have the same duration. In some examples, a frame may be divided (e.g., in the time domain) into subframes, and each subframe may be further divided into a number of slots. Alternatively, each frame may include a variable number of slots, and the number of slots may depend on subcarrier spacing. Each slot may include a number of symbol periods (e.g., depending on the length of the cyclic prefix prepended to each symbol period). In some wireless communications systems 100, a slot may further be divided into multiple mini-slots containing one or more symbols. Excluding the cyclic prefix, each symbol period may contain one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., the number of symbol periods in a TTI) may be variable. Additionally or alternatively, the smallest scheduling unit of the wireless communications system 100 may be dynamically selected (e.g., in bursts of shortened TTIs (sTTIs)).

Physical channels may be multiplexed on a carrier according to various techniques. A physical control channel and a physical data channel may be multiplexed on a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a number of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to a number of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

Each base station 105 may provide communication coverage via one or more cells, for example a macro cell, a small cell, a hot spot, or other types of cells, or any combination thereof. The term "cell" may refer to a logical communication entity used for communication with a base station 105 (e.g., over a carrier) and may be associated with an identifier for distinguishing neighboring cells (e.g., a physical cell identifier (PCID), a virtual cell identifier (VCID), or others). In some examples, a cell may also refer to a geographic coverage area 110 or a portion of a geographic coverage area 110 (e.g., a sector) over which the logical communication entity operates. Such cells may range from smaller areas (e.g., a structure, a subset of structure) to larger areas depending on various factors such as the capabilities of the base station 105. For example, a cell may be or include a building, a subset of a building, or exterior spaces between or overlapping with geographic coverage areas 110, among other examples.

A macro cell generally covers a relatively large geographic area (e.g., several kilometers in radius) and may allow unrestricted access by the UEs 115 with service subscriptions with the network provider supporting the macro cell. A small cell may be associated with a lower-powered base station 105, as compared with a macro cell, and a small cell may operate in the same or different (e.g., licensed, unlicensed) frequency bands as macro cells. Small cells may provide unrestricted access to the UEs 115 with service subscriptions with the network provider or may provide restricted access to the UEs 115 having an association with the small cell (e.g., the UEs 115 in a closed subscriber group (CSG), the UEs 115 associated with users in a home or office). A base station 105 may support one or multiple cells and may also support communications over the one or more cells using one or multiple component carriers.

In some examples, a carrier may support multiple cells, and different cells may be configured according to different protocol types (e.g., MTC, narrowband IoT (NB-IoT), enhanced mobile broadband (eMBB)) that may provide access for different types of devices.

In some examples, a base station 105 may be movable and therefore provide communication coverage for a moving geographic coverage area 110. In some examples, different geographic coverage areas 110 associated with different technologies may overlap, but the different geographic coverage areas 110 may be supported by the same base station 105. In other examples, the overlapping geographic coverage areas 110 associated with different technologies may be supported by different base stations 105. The wireless communications system 100 may include, for example, a heterogeneous network in which different types of the base stations 105 provide coverage for various geographic coverage areas 110 using the same or different radio access technologies.

The wireless communications system 100 may support synchronous or asynchronous operation. For synchronous operation, the base stations 105 may have similar frame timings, and transmissions from different base stations 105 may be approximately aligned in time. For asynchronous operation, the base stations 105 may have different frame timings, and transmissions from different base stations 105 may, in some examples, not be aligned in time. The techniques described herein may be used for either synchronous or asynchronous operations.

Some UEs 115, such as MTC or IoT devices, may be low cost or low complexity devices and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay such information to a central server or application program that makes use of the information or presents the information to humans interacting with the application program. Some UEs 115 may be designed to collect information or enable automated behavior of machines or other devices. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

Some UEs 115 may be configured to employ operating modes that reduce power consumption, such as half-duplex communications (e.g., a mode that supports one-way communication via transmission or reception, but not transmission and reception simultaneously). In some examples, half-duplex communications may be performed at a reduced peak rate. Other power conservation techniques for the UEs 115 include entering a power saving deep sleep mode when not engaging in active communications, operating over a limited bandwidth (e.g., according to narrowband communications), or a combination of these techniques. For example, some UEs 115 may be configured for operation using a narrowband protocol type that is associated with a defined portion or range (e.g., set of subcarriers or resource blocks (RBs)) within a carrier, within a guard-band of a carrier, or outside of a carrier.

The wireless communications system 100 may be configured to support ultra-reliable communications or low-latency communications, or various combinations thereof. For example, the wireless communications system 100 may be configured to support ultra-reliable low-latency communications (URLLC) or mission critical communications. The UEs 115 may be designed to support ultra-reliable, low-latency, or critical functions (e.g., mission critical functions). Ultra-reliable communications may include private communication or group communication and may be supported by one or more mission critical services such as mission critical push-to-talk (MCPTT), mission critical video (MCVideo), or mission critical data (MCData). Support for mission critical functions may include prioritization of services, and mission critical services may be used for public safety or general commercial applications. The terms ultra-reliable, low-latency, mission critical, and ultra-reliable low-latency may be used interchangeably herein.

In some examples, a UE 115 may also be able to communicate directly with other UEs 115 over a device-to-device (D2D) communication link 135 (e.g., using a peer-to-peer (P2P) or D2D protocol). One or more UEs 115 utilizing D2D communications may be within the geographic coverage area 110 of a base station 105. Other UEs 115 in such a group may be outside the geographic coverage area 110 of a base station 105 or be otherwise unable to receive transmissions from a base station 105. In some examples, groups of the UEs 115 communicating via D2D communications may utilize a one-to-many (1:M) system in which each UE 115 transmits to every other UE 115 in the group. In some examples, a base station 105 facilitates the scheduling of resources for D2D communications. In other cases, D2D communications are carried out between the UEs 115 without the involvement of a base station 105.

In some systems, the D2D communication link 135 may be an example of a communication channel, such as a sidelink communication channel, between vehicles (e.g., UEs 115). In some examples, vehicles may communicate using vehicle-to-everything (V2X) communications, vehicle-to-vehicle (V2V) communications, or some combination of these. A vehicle may signal information related to traffic conditions, signal scheduling, weather, safety, emergencies, or any other information relevant to a V2X system. In some examples, vehicles in a V2X system may communicate with roadside infrastructure, such as roadside units, or with the network via one or more network nodes (e.g., base stations 105) using vehicle-to-network (V2N) communications, or with both.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the base stations 105 associated with the core network 130. User IP packets may be transferred through the user plane entity, which may provide IP address allocation as well as other functions. The user plane entity may be connected to the network operators IP services 150. The operators IP services 150 may include access to the Internet, Intranet(s), an IP Multimedia Subsystem (IMS), or a Packet-Switched Streaming Service.

Some of the network devices, such as a base station 105, may include subcomponents such as an access network entity 140, which may be an example of an access node controller (ANC). Each access network entity 140 may communicate with the UEs 115 through one or more other access network transmission entities 145, which may be referred to as radio heads, smart radio heads, or transmission/reception points (TRPs). Each access network transmission entity 145 may include one or more antenna panels. In some configurations, various functions of each access network entity 140 or base station 105 may be distributed across various network devices (e.g., radio heads and ANCs) or consolidated into a single network device (e.g., a base station 105).

The wireless communications system 100 may operate using one or more frequency bands, typically in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. The UHF waves may be blocked or redirected by buildings and environmental features, but the waves may penetrate structures sufficiently for a macro cell to provide service to the UEs 115 located indoors. The transmission of UHF waves may be associated with smaller antennas and shorter ranges (e.g., less than 100 kilometers) compared to transmission using the smaller frequencies and longer waves of the high frequency (HF) or very high frequency (VHF) portion of the spectrum below 300 MHz.

The wireless communications system 100 may also operate in a super high frequency (SHF) region using frequency bands from 3 GHz to 30 GHz, also known as the centimeter band, or in an extremely high frequency (EHF) region of the spectrum (e.g., from 30 GHz to 300 GHz), also known as the millimeter band. In some examples, the wireless communications system 100 may support millimeter wave (mmW) communications between the UEs 115 and the base stations 105, and EHF antennas of the respective devices may be smaller and more closely spaced than UHF antennas. In some examples, this may facilitate use of antenna arrays within a device. The propagation of EHF transmissions, however, may be subject to even greater atmospheric attenuation and shorter range than SHF or UHF transmissions. The techniques disclosed herein may be employed across transmissions that use one or more different frequency regions, and designated use of bands across these frequency regions may differ by country or regulating body.

The wireless communications system 100 may utilize both licensed and unlicensed radio frequency spectrum bands. For example, the wireless communications system 100 may employ License Assisted Access (LAA), LTE-Unlicensed (LTE-U) radio access technology, or NR technology in an unlicensed band such as the 5 GHz industrial, scientific, and medical (ISM) band. When operating in unlicensed radio frequency spectrum bands, devices such as the base stations 105 and the UEs 115 may employ carrier sensing for collision detection and avoidance. In some examples, operations in unlicensed bands may be based on a carrier aggregation configuration in conjunction with component carriers operating in a licensed band (e.g., LAA). Operations in unlicensed spectrum may include downlink transmissions, uplink transmissions, P2P transmissions, or D2D transmissions, among other examples.

A base station 105 or a UE 115 may be equipped with multiple antennas, which may be used to employ techniques such as transmit diversity, receive diversity, multiple-input multiple-output (MIMO) communications, or beamforming. The antennas of a base station 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations. Additionally or alternatively, an antenna panel may support radio frequency beamforming for a signal transmitted via an antenna port.

The base stations 105 or the UEs 115 may use MIMO communications to exploit multipath signal propagation and increase the spectral efficiency by transmitting or receiving multiple signals via different spatial layers. Such techniques may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream and may carry bits associated with the same data stream (e.g., the same codeword) or different data streams (e.g., different codewords). Different spatial layers may be associated with different antenna ports used for channel measurement and reporting. MIMO techniques include single-user MIMO (SU-MIMO), where multiple spatial layers are transmitted to the same receiving device, and multiple-user MIMO (MU-MIMO), where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating at particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

A base station 105 or a UE 115 may use beam sweeping techniques as part of beam forming operations. For example, a base station 105 may use multiple antennas or antenna arrays (e.g., antenna panels) to conduct beamforming operations for directional communications with a UE 115. Some signals (e.g., synchronization signals, reference signals, beam selection signals, or other control signals) may be transmitted by a base station 105 multiple times in different directions. For example, the base station 105 may transmit a signal according to different beamforming weight sets associated with different directions of transmission. Transmissions in different beam directions may be used to identify (e.g., by a transmitting device, such as a base station 105, or by a receiving device, such as a UE 115) a beam direction for later transmission or reception by the base station 105.

Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based on a signal that was transmitted in one or more beam directions. For example, a UE 115 may receive one or more of the signals transmitted by the base station 105 in different directions and may report to the base station 105 an indication of the signal that the UE 115 received with a highest signal quality or an otherwise acceptable signal quality.

In some examples, transmissions by a device (e.g., by a base station 105 or a UE 115) may be performed using multiple beam directions, and the device may use a combination of digital precoding or radio frequency beamforming to generate a combined beam for transmission (e.g., from a base station 105 to a UE 115). The UE 115 may report feedback that indicates precoding weights for one or more beam directions, and the feedback may correspond to a configured number of beams across a system bandwidth or one or more sub-bands. The base station 105 may transmit a reference signal (e.g., a cell-specific reference signal (CRS), a channel state information reference signal (CSI-RS)), which may be precoded or unprecoded. The UE 115 may provide feedback for beam selection, which may be a precoding matrix indicator (PMI) or codebook-based feedback (e.g., a multi-panel type codebook, a linear combination type codebook, a port selection type codebook). Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115) or for transmitting a signal in a single direction (e.g., for transmitting data to a receiving device).

A receiving device (e.g., a UE 115) may try multiple receive configurations (e.g., directional listening) when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets (e.g., different directional listening weight sets) applied to signals received at multiple antenna elements of an antenna array, or by processing received signals according to different receive beamforming weight sets applied to signals received at multiple antenna elements of an antenna array, any of which may be referred to as "listening" according to different receive configurations or receive directions. In some examples, a receiving device may use a single receive configuration to receive along a single beam direction (e.g., when receiving a data signal). The single receive configuration may be aligned in a beam direction determined based on listening according to different receive configuration directions (e.g., a beam direction determined to have a highest signal strength, highest signal-to-noise ratio (SNR), or otherwise acceptable signal quality based on listening according to multiple beam directions).

The wireless communications system 100 may be a packet-based network that operates according to a layered protocol stack. In the user plane, communications at the bearer or Packet Data Convergence Protocol (PDCP) layer may be IP-based. A Radio Link Control (RLC) layer may perform packet segmentation and reassembly to communicate over logical channels. A Medium Access Control (MAC) layer may perform priority handling and multiplexing of logical channels into transport channels. The MAC layer may also use error detection techniques, error correction techniques, or both to support retransmissions at the MAC layer to improve link efficiency. In the control plane, the Radio Resource Control (RRC) protocol layer may provide establishment, configuration, and maintenance of an RRC connection between a UE 115 and a base station 105 or a core network 130 supporting radio bearers for user plane data. At the physical layer, transport channels may be mapped to physical channels.

The UEs 115 and the base stations 105 may support retransmissions of data to increase the likelihood that data is received successfully. Hybrid automatic repeat request (HARQ) feedback is one technique for increasing the likelihood that data is received correctly over a communication link 125. HARQ may include a combination of error detection (e.g., using a cyclic redundancy check (CRC)), forward error correction (FEC), and retransmission (e.g., automatic repeat request (ARQ)). HARQ may improve throughput at the MAC layer in poor radio conditions (e.g., low signal-to-noise conditions). In some examples, a device may support same-slot HARQ feedback, where the device may provide HARQ feedback in a specific slot for data received in a previous symbol in the slot. In other cases, the device may provide HARQ feedback in a subsequent slot, or according to some other time interval.

Some wireless communications systems 100 may support broadcasting packets to a set of UEs 115. For example, a network node (e.g., a base station 105, UE 115, or the like) may broadcast the packets and may be referred to as a transmitter. The transmitter may broadcast multiple packets to multiple receivers (e.g., UEs 115). The broadcasting may be repeated blindly without the transmitters knowledge of packets that have been decoded by the receivers. That is, if the broadcasting system does not utilize feedback associated with packets, the transmitter may continue to transmit packets blindly without any indication of packets that have actually been decoded by the UEs 115. Thus, the transmitter may rebroadcast packets in a wasteful manner, since some packets may have been decoded by all UEs 115. Thus, the lack of feedback may result in a waste of resources, unnecessary duplication of packets, and low efficiency.

Techniques described herein may support a packet broadcasting design that uses feedback received from the UEs 115 for determining when to terminate encoding packets and transmitting encoded packets. A transmitter (e.g., a base station 105) may identify a set of packets for broadcasting to a set of UEs 115 (e.g., a set of receivers) and transmit a set of network encoded packets based on the set of packets. Each of the receiving UEs 115 may provide feedback associated with reception of the broadcasted packets. For example, feedback received from a particular UE 115 may indicate a number of successfully received packets of the set of network encoded packets by the UE 115. In some implementations, one or more UEs 115 of the set of UEs 115 may indicate the number of successfully received packets by transmitting a number of missed packets from the set of network encoded packets. Additionally or alternatively, one or more UEs 115 of the set of UEs 115 may indicate the number of successfully received packets by transmitting individual acknowledgment feedback indications for each packet of the set of network encoded packets (e.g., a '0' to indicate a corresponding packet was unsuccessfully received and a '1' to indicate a corresponding packet is successfully received).

Subsequently, the network device may use this feedback to determine whether at least one UE 115 of the set of UEs 115 had a number of successfully received packets that fails to satisfy a decodability threshold (e.g., the decodability threshold may indicate a number of successfully received packets that indicates successful reception of a message carried by the set of packets). If at least one UE 115 fails to satisfy the decodability threshold with a corresponding number of successfully received packets, the network node may transmit a second set of network encoded packets to the set of UEs 115 (e.g., via a broadcast message or via unicast messages to UEs 115 that fail to satisfy the decodability threshold), and each of the UEs 115 may again respond with respective feedbacks indicating the number of successfully received packets for the second set of network encoded packets. The network node may continue to transmit additional sets of network encoded packets until each UE 115 of the set of UEs 115 satisfies the decodability threshold. Once each UE 115 satisfies the decodability threshold, the network node may terminate coding of the set of packets and may stop broadcasting or transmitting sets of encoded packets for the set of packets.

Using this technique, receivers of the network encoded packets may decrease signaling overhead and simplify signal processing by reporting the feedback to indicate the number of successfully received packets of the network encoded packets without additional information. Reporting the indication to represent the number of successfully received packets of the network encoded packets may result in increased efficiencies in the wireless communications system 100 and, more particularly, a broadcasting system.

Figure 2:
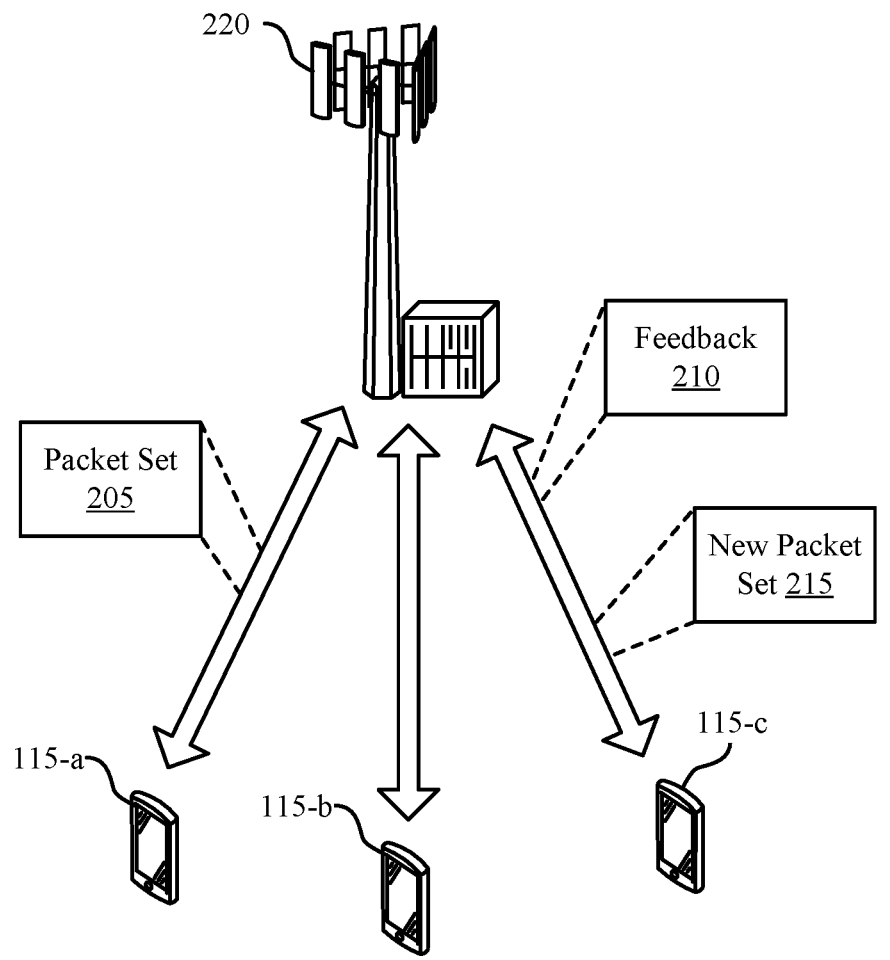
FIG. 2 illustrates an example of a wireless communications system that supports feedback design for network coding termination in broadcasting in accordance with aspects of the present disclosure.

FIG. 2 illustrates an example of a wireless communications system 200 that supports broadcasting packets using network coding with feedback in accordance with aspects of the present disclosure. In some examples, wireless communications system 200 may implement aspects of or may be implemented by aspects of wireless communications system 100. For example, wireless communications system 200 may include a network entity 220 and one or more UEs 115, such as a UE 115-a, a UE 115-b, and a UE 115-c, which may be examples of corresponding devices as described with reference to FIG. 1. Wireless communications system 200 may illustrate an example of a packet broadcasting system. The network entity 220 may be an example of a base station 105 as described with reference to FIG. 1, a network node, a transmitter, or the like.

The network entity 220 may configure the UE 115-a, UE 115-b, and UE 115-c with network coding parameters, such as an encoding matrix, encoding/decoding function, network coding algorithms, maximum number of decoding iterations, etc., such that the network coding parameters are synchronized between the network entity 220 and the UEs 115. These parameters may be used by the UEs 115 to decode encoded packets transmitted by the network entity 220. Network coding data transmission between transmitter and receiver may be used, and the network coding parameters (e.g., encoding matrix, encoding function, decoding function, network coding algorithms, maximum number of decoding iterations, etc.) may be synchronized between the transmitter and receiver. For example, a row of the encoding matrix may indicate an ordering or grouping of network encoded packets that are transmitted to the UEs 115.

The network coding parameters may be signaled using medium access control (MAC)-control element (CE) signaling, downlink control information (DCI), RRC signaling (e.g., an RRC configuration), or a combination thereof. In some examples, the network entity 220 may configure the UEs 115 with multiple sets of network coding parameters via RRC signaling and may indicate one or more of the multiple sets of network coding parameters to the UEs 115 via DCI or MAC-CE signaling. For example, the network entity 220 may configure the UEs 115 with an initial set of network coding parameters via RRC signaling and may indicate a different set of network coding parameters to the UEs 115 via DCI or MAC-CE signaling. That is, the network entity 220 may use RRC signaling to configure network coding parameters and may use DCI or MAC-CE signaling to switch network coding parameters.

The network entity 220 may identify a set of packets for transmission to the UEs 115. That is, one transmitter (e.g., the network entity 220) may send a message (e.g., via the set of packets) to multiple receivers (e.g., the UEs 115). In one example, the network entity 220 may identify the set of packets from a packet pool, which may be a set of packets scheduled for broadcasting. In some examples, the broadcasting may support a content streaming service and the packets may correspond to the streamed content. From the set of packets, the network entity 220 may encode (e.g., using the indicated encoding function and matrix) and transmit a set of network encoded packets 205 to the UEs 115 in a broadcast manner.

Each of the UEs 115 may receive and attempt to decode the set of network encoded packets 205. The UEs 115 may transmit feedback 210 to the network entity 220 based on attempting to decode the set of network encoded packets 205, and the feedback 210 may indicate a number of successfully received packets of the first set of network encoded packets (e.g., a number of successfully received encoded packets). That is, the UEs 115 may provide the feedback 210 (e.g., feedback information) to the network entity 220 (e.g., from receiver to transmitter) to indicate missed packets information of the set of network encoded packets 205. For example, each UE 115 may indicate a number of missed encoded packets from the set of network encoded packets 205. Additionally or alternatively, each UE 115 may indicate individual acknowledgment feedback indications for each encoded packet of the set of network encoded packets 205 (e.g., a '0' to indicate a corresponding encoded packet was not received and a '1' to indicate a corresponding packet is successfully received).

As noted herein, the feedback 210 may include a simplified feedback design to indicate necessary information (e.g., a number of successfully received packets) needed by the network entity 220 to determine to terminate encoding the set of packets and transmitting encoded packets to the UEs 115. In some cases, if the set of network encoded packets 205 include RLC packets, the simplified feedback design may use RLC status report transmissions, MAC HARQ feedback transmissions, or an additional feedback mechanism to indicate a number of successfully received packets of the set of network encoded packets 205. For example, the UEs 115 may transmit an RLC status report after every transmission instance and, in an information field of the RLC status report, may indicate a number of packets received or missed from the set of network encoded packets 205. Additionally or alternatively, the UEs 115 may transmit MAC HARQ feedback after every reception of a packet and, in an information field of the MAC HARQ feedback, may include 1s and 0s, with a '1' indicating successful reception of a corresponding packet of the set of network encoded packets 205 and a '0' otherwise (e.g., unsuccessful reception or decoding of a corresponding packet of the set of network encoded packets 205).

Based on receiving the feedback 210, the network entity 220 may determine whether each of the UEs 115 successfully received the set of packets (e.g., a message carried by the set of packets). For example, the network entity 220 may determine a decodability threshold value (e.g., decodable threshold, represented by D) that indicates a number of packets from the set of packets that must be received by a UE 115 to represent that the UE 115 can successfully receive and decode the message carried by the set of network encoded packets 205. In some cases, the decodability threshold value may be synchronized between the network entity 220 and the UEs 115 (e.g., signaled with the network coding parameters) and may correspond to an encoding process used by the network entity when encoding the set of packets to generate the set of network encoded packets 205.

Subsequently, the network entity 220 may use this decodability threshold value and the feedback 210 (e.g., indicating the number of successfully received packets for each UE 115) to identify whether each of the UEs 115 successfully received the set of packets according to the decodability threshold value. That is, the network entity 220 may determine a number of successfully received packets (e.g., represented by $C_i$ for each UE i) from each UE 115 based on the feedback 210 and may compare this number of successfully received packets for each UE 115 to the decodability threshold value to determine whether each UE 115 successfully received a sufficient amount of the set of packets (e.g., or enough of the packets to warrant a successful reception of the set of packets). Additionally, the network entity 220 may configure a $C_i$ for each UE i (e.g., each receiver) to store corresponding information for each UE 115 on how many packets of the set of network encoded packets 205 are successfully received by each UE 115.

If at least one UE 115 has a number of successfully received packets that fails to satisfy (e.g., is less than) the decodability threshold value (e.g., as indicated by the feedback 210), the network entity 220 (e.g., the transmitter) may send a new set of network encoded packets 215 (e.g., for the same set of packets or a different set of packets) until the network entity 220 determines all packets of the set of packets (e.g., or a number of packets that satisfies the decodability threshold value) have been received and recovered by all receivers (e.g., by each UE 115). For example, after each transmission of a set of network encoded packets, each UE 115 may transmit the feedback 210 to indicate the number of successfully received packets for that respective set of network encoded packets, and the network entity 220 may determine whether all of the UEs 115 have a sufficient amount of successfully received packets compared to the decodability threshold value before transmitting an additional set of network encoded packets again or not.

In some implementations, the network entity 220 may transmit each set of network encoded packets via a broadcast message to the UEs 115. Additionally or alternatively, once a number of UEs 115 that have successfully received an insufficient number of packets (e.g., number of successfully received packets is less than the decodability threshold value) falls below a threshold (e.g., less than N UEs 115 have unsuccessfully received a number of packets the set of packets), the network entity 220 may transmit sets of network encoded packets to those UEs 115 who have failed to satisfy the decodability threshold value with their numbers of successfully received packets via unicast messages (e.g., directly to those UEs 115). Once each UE 115 satisfies the decodability threshold value, the network entity 220 may terminate coding of the set of packets and may stop broadcasting or transmitting (e.g., via unicast) sets of encoded packets for the set of packets.

Additionally, in some implementations, one or more sets of network coding parameters may be configured at the UEs 115. If one set of parameters is configured at one or more of the UEs 115 and the network entity 220 determines that the transmission is underperforming (e.g., that the feedback 210 indicates that a relatively high number of packets are not being successfully received), then the network entity 220 may transmit a new set of network coding parameters to the UEs 115 (e.g., via MAC CE or DCI). In other cases, the UE 115 may request an updated set of network coding parameters (e.g., via MAC CE or uplink control information (UCI)). In either case, after the updated set of parameters is transmitted, subsequent sets of packets may be encoded and transmitted according to the updated set of parameters. If multiple sets of network coding parameters are synchronized between the network entity 220 and the UEs 115, then the network entity 220 may transmit an instruction to switch between sets of parameters (e.g., based on underperformance or based on a request from a UE 115 received via MAC CE or UCI) via MAC CE or DCI.

Figure 3:
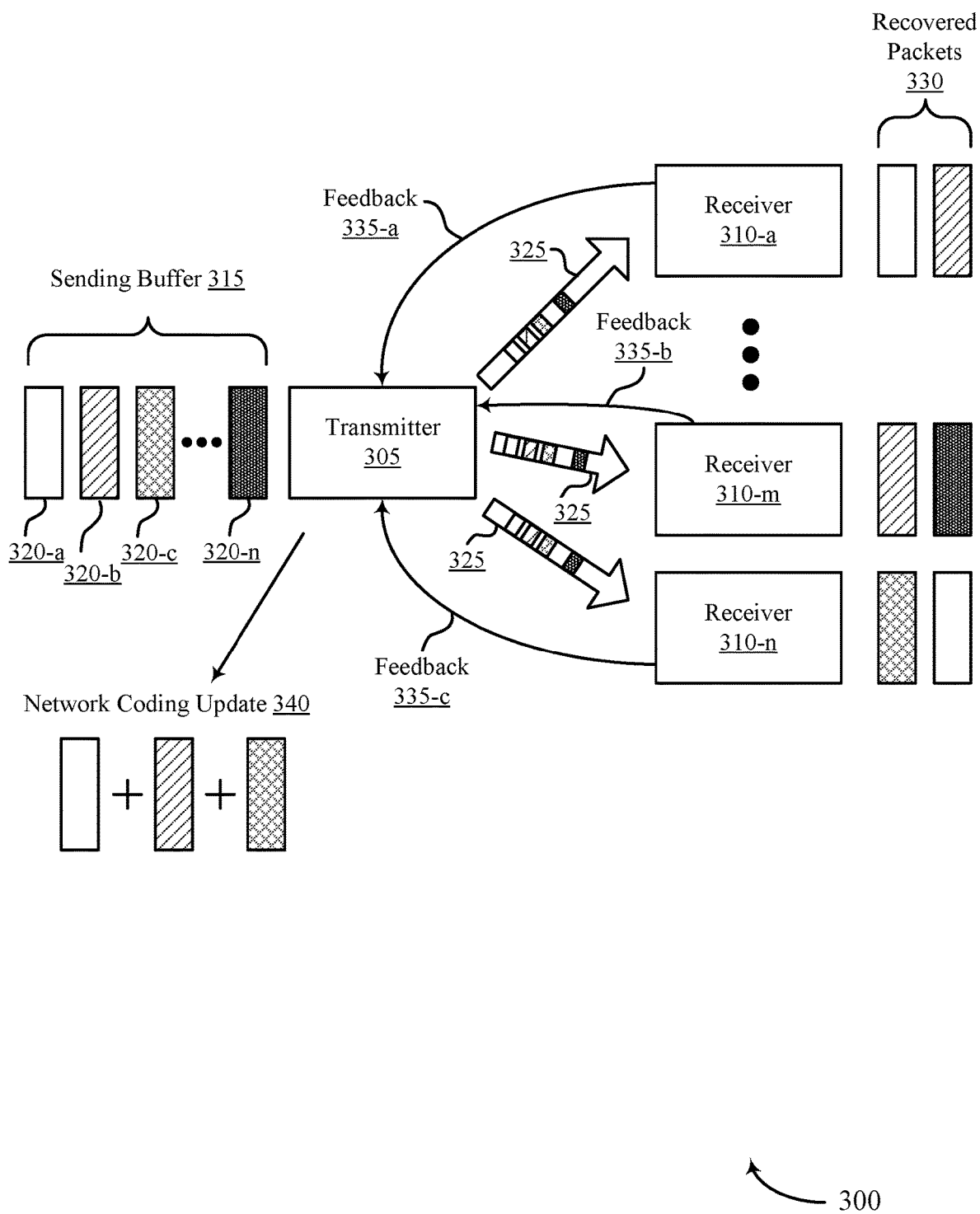
FIG. 3 illustrates an example of a feedback configuration in accordance with aspects of the present disclosure.

FIG. 3 illustrates an example of a feedback configuration 300 that supports feedback design for network coding termination in broadcasting in accordance with aspects of the present disclosure. In some examples, feedback configuration 300 may implement aspects of or may be implemented by aspects of wireless communications system 100, wireless communications system 200, or both. For example, feedback configuration 300 may include a transmitter 305 (e.g., a base station 105, a network entity, a network device, etc.) and one or more receivers 310 (e.g., UEs 115) that represent corresponding examples of respective devices as described with reference to FIGS. 1 and 2. As shown, feedback configuration 300 may include n receivers 310, such as a first receiver 310-a, an m-th receiver 310-m, and an n-th receiver 310-n.

In some cases, the transmitter 305 may broadcast a data transmission using network coding, where the transmitter 305 sends same packets to the multiple receivers 310. For example, the data transmission may include a sending buffer 315 that includes one or more packets 320, such as a first packet 320-a, a second packet 320-b, a third packet 320-c, etc., up to an n-th packet 320-n. Subsequently, the transmitter 305 may then transmit the packets 320 to the receivers 310 via a broadcast 325. Based on attempting to decode the packets 320, each receiver 310 may determine one or more recovered packets 330 (e.g., successfully received packets) of the packets 320 from the sending buffer 315.

Additionally, feedback configuration 300 may include one or more feedback transmissions 335 from each of the receivers 310, where the feedback transmissions 335 exist as part of broadcasting systems. The feedback transmissions 335 may indicate packet reception information for each receiver 310. For example, the first receiver 310-a may transmit a first feedback transmission 335-a to indicate the first packet 320-a and the second packet 320-b were successfully recovered, the m-th receiver 310-m may transmit a second feedback transmission 335-b to indicate the second packet 320-b and the n-th packet 320-n were successfully recovered, and the n-th receiver 310-n may transmit a third feedback transmission 335-c to indicate the third packet 320-c and the first packet 320-a were successfully recovered. Accordingly, with the feedback transmissions, the transmitter 305 may determine when the packets 320 have been recovered at the receivers 310, and the transmitter may terminate the transmission of the packets 320.

In some cases, information included in the feedback transmissions 335 may be complicated by also including individual packet acknowledgment information (e.g., positive acknowledgment (ACK)/negative acknowledgment (NACK) information), channel quality estimation, signal measurements (e.g., signal-to-interference-plus-noise ratio (SINR), reference signal received power (RSRP) value, etc.), and additional information. In some cases, this additional information in the feedback transmissions 335 (e.g., and the information on the recovered packets 330, such as information about the first packet 320-a, the second packet 320-b, and the third packet 320-c) may enable the transmitter to perform a network coding update 340 (e.g., to modify coding parameters to enable the receivers 310 to successfully receive and decode the packets 320). However, for a network coding termination algorithm (e.g., Luby Transform codes, Raptor codes, etc.), the transmitter 305 may only need to know a number of received packets at each receiver 310 to determine when to terminate encoding of the packets and for ending transmission of the packets.

As described herein and with reference to FIG. 2, techniques are described for a feedback configuration that can be simplified for network coding packets termination in broadcast channels. For example, rather than transmitting extraneous information (e.g., channel quality estimation, SINR, RSRP, etc.) with the feedback transmissions 335, each of the receivers 310 may transmit an indication of a number of successfully received packets in the feedback transmissions 335. The transmitter 305 may compare these indications of the number of successfully received packets from each receiver 310 to a decodability threshold value (e.g., configured to the encoding process used by the transmitter 305) to determine whether one or more of the receivers 310 did not satisfy the decodability threshold value with their respective number of successfully received packets (e.g., indicating the message carried by the packets is not successfully received and decoded by the corresponding receiver 310). Accordingly, if at least one receiver 310 failed to satisfy the decodability threshold value after a given transmission of the packets 320, the transmitter 305 may continue to transmit (e.g., via broadcast or unicast) the packets 320 (e.g., encoded packets) to the receivers 310 until all receivers 310 successfully receive the packets 320 according to the decodability threshold value.

Figure 4:
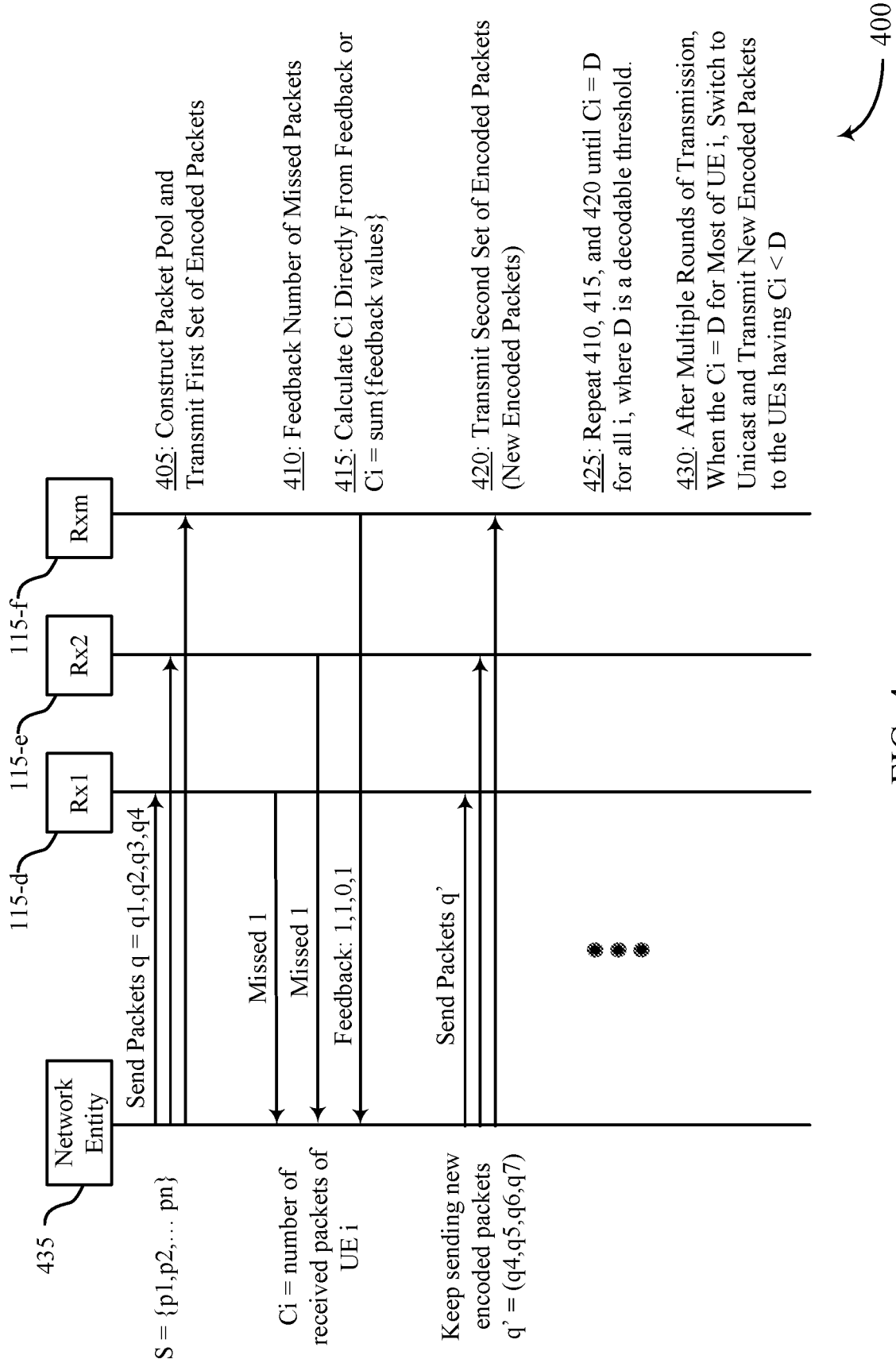
FIG. 4 illustrates an example of a process flow diagram that supports feedback design for network coding termination in broadcasting in accordance with aspects of the present disclosure.

FIG. 4 illustrates an example of a process flow diagram 400 that supports feedback design for network coding termination in broadcasting in accordance with aspects of the present disclosure. In some examples, process flow diagram 400 may implement aspects of or may be implemented by aspects of wireless communications system 100, wireless communications system 200, or both. The process flow diagram 400 may include a network entity 435 and one or more receivers (e.g., UEs 115), which may be examples of the corresponding devices as described with reference to FIGS. 1-3. In some cases, the one or more receivers may include a first UE 115-d (e.g., a first receiver (Rx1)), a second UE 115-e (e.g., a second receiver (Rx2)), and a third UE 115-f (e.g., an m-th receiver (Rxm)).

At 405, the network entity 435 may construct a packet pool S={p1, p2 . . . pn}, where {p1, p2 . . . pn} represent individual packets in the packet pool, S. Additionally, the network entity 435 may encode the set of packets in the packet pool using an encoding function f(S) (e.g., a network coding encoding function for the packet pool, S) and may transmit this set of network encoded packets (e.g., network coding encoded packets) to the UEs 115. For example, the set of network encoded packets may be represented by q, where q=f(S)=(q1, q2, q3, q4, . . . , qN), and N can be arbitrarily large. Each of q1, q2, q3, q4, . . . qN may represent an individual network encoded packet of the set of network encoded packets. As an example shown in process flow diagram 400, the network entity 435 may transmit four (4) network encoded packets with the set of network encoded packets, q, where the four (4) network encoded packets are represented by q=(q1, q2, q3, q4).

At 410, the UEs 115 (e.g., receivers) may feedback a number of missed packets to the network entity 435. For example, the UEs 115 may indicate an explicit number of missed packets, such as the first UE 115-d and the second UE 115-e transmitting that they missed one (1) of the network encoded packets each (e.g., "Missed 1"). Additionally or alternatively, the UEs 115 may indicate individual acknowledgment feedbacks (e.g., a '1' or '0') to indicate whether each network encoded packet was received or not, such as the third UE 115-f transmitting that a first, second, and fourth network encoded packet were successfully received and a third network encoded packet was unsuccessfully received (e.g., "Feedback: 1,1,0,1").

At 415, for both implementations on how the UEs 115 transmit the feedback (e.g., with a number of missed packets or with individual acknowledgment feedbacks per network encoded packet), the network entity 435 may determine (e.g., calculate) a number of received packets (e.g., represented by $C_i$) for each UE 115. For example, the network entity 435 may calculate $C_i$ directly from the feedback or $C_i$=sum{feedback values}. In the example of process flow diagram 400, each of the UEs 115 may have successfully received three (3) of the four (4) network encoded packets, such that a $C_i$ value for each UE 115 is equal to three (3). That is, both the first UE 115-d and the second UE 115-e may report that they each missed one (1) packet of the four (4) network encoded packets transmitted by the network entity 435, indicating that each of the first UE 115-d and the second UE 115-e successfully received three (3) network encoded packets (e.g., $C_1$=3 for the first UE 115-d and $C_2$=3 for the second UE 115-e). Additionally, the third UE 115-f may report that one (1) packet was also missed by transmitting one (1) '0' with the feedback and three (3) '1's, indicating that the third UE 115-f also successfully received three (3) network encoded packets (e.g., $C_3$=3 for the third UE 115-f).

At 420, the network entity 435 may transmit a second set of network encoded packets (e.g., new encoded packets) based on the UEs 115 not fully receiving and decoding all of the network encoded packets. For example, the second set of network encoded packets may be represented by q'=(q4, q5, q6, q7). Additionally, the network entity 435 may transmit the second set of network encoded packets to all of the UEs 115 via a broadcast message even if one or more of the UEs 115 do fully receive and decode all of the network encoded packets.

At 425, the network entity 435 may repeat 410, 415, and 420 until $C_i \geq D$ for each UE 115 (e.g., each UE i), where D represents a decodability threshold value (e.g., decodable threshold). For example, the decodability threshold value may correspond to an encoding process used by the network entity 435 when generating the set of network encoded packets, q, from the packet pool, S. Additionally, the decodability threshold value may represent an amount of network encoded packets that need to be successfully received by a receiver (e.g., UE 115) to indicate that the receiver can successfully receive and decode a message carried by the network encoded packets.

In some implementations, at 430 (e.g., after several rounds of transmission of network encoded packets), when the $C_i \geq D$ for most of the UEs 115, the network entity 435 may switch to unicast and may transmit new encoded packets only to any UEs 115 having $C_i < D$. That is, if a number of UEs 115 that have successfully received the message carried with the network encoded packets as indicated by the decodability threshold value exceeds a threshold, the network entity 435 may transmit subsequent network encoded packets to the remaining UEs 115 that have not successfully received the message via unicast transmissions directly to those remaining UEs 115.

Figure 5:
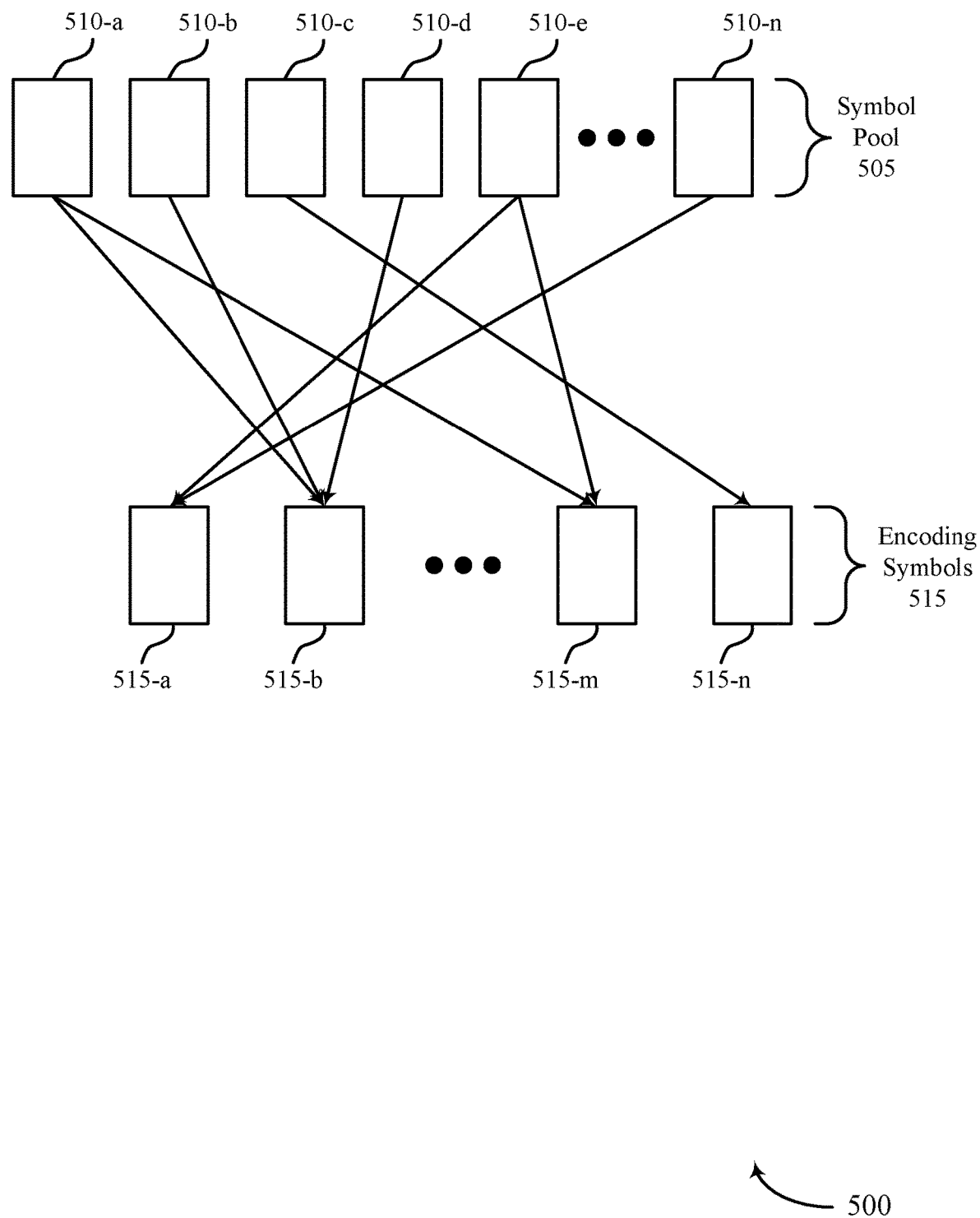
FIG. 5 illustrates an example of an encoding process in accordance with aspects of the present disclosure.

FIG. 5 illustrates an example of an encoding process 500 that supports feedback design for network coding termination in broadcasting in accordance with aspects of the present disclosure. In some examples, encoding process 500 may implement aspects of or may be implemented by aspects of wireless communications system 100, wireless communications system 200, or both. For example, encoding process 500 may include a rateless code that can be used by a base station 105 and/or a UE 115 to encode a set of packets. In particular, encoding process 500 may represent a Luby transform code that a transmitting device or encoder (e.g., a base station 105) uses when encoding a set of packets to transmit to a receiving device or decoder (e.g., a UE 115).

The encoder may select a set of symbols from a symbol pool 505 to encode for transmitting to the decoder. For example, the symbol pool 505 may include k symbols 510, and the encoder may select n of the k symbols 510, such as a first symbol 510-a, a second symbol 510-b, a third symbol 510-c, a fourth symbol 510-d, a fifth symbol 510-e, etc., to an n-th symbol 510-n. Each of the selected symbols 510 from the symbol pool 505 may then be encoded by the encoder to one or more encoding symbols 515, such as a first encoding symbol 515-a, a second encoding symbol 515-b, an m-th encoding symbol 515-m, and an n-th encoding symbol 515-n. In some cases, the encoding of the symbols 510 to the encoding symbols 515 may depend on a packet pool encoding function, f, on which the encoder is operating. For example, the packet pool encoding function, f, may include the encoder determining a degree, d, of each encoding symbol 515.

The degree may be chosen at random from a given node degree distribution, p(x). Subsequently, the encoder may choose 'd' distinct symbols 510 (e.g., information symbols) from the symbol pool 505 uniformly at random. These 'd' distinct symbols may be elements of the encoding symbol 515. For example, d=2 for the first encoding symbol 515-a with the fifth symbol 510-e and the n-th symbol 510-n being the elements of the first encoding symbol 515-a, d=3 for the second encoding symbol 515-b with the first symbol 510-a and the second symbol 510-b and the fourth symbol 510-d being the elements of the second encoding symbol 515-b, d=2 for the m-th encoding symbol 515-m with the first symbol 510-a and fifth symbol 510-e being the elements of the m-th encoding symbol 515-m, and d=1 for the n-th encoding symbol 515-n with the third symbol 510-c being the element of the n-th encoding symbol 515-n. The encoder may then assign an exclusive or (XOR) operation of the chosen 'd' symbols 510 (e.g., information symbols) to the encoding symbol 515.

In some cases, an ideal soliton distribution for the encoding process may include P1=1/k or Pi=1/i(i−1) for i=2, 3, . . . , k, with k representing the number of symbols 510 in the symbol pool 505. Additionally or alternatively, a robust soliton distribution for the encoding process may include Mi=(Pi+Ti)/B, for i=1, 2, . . . , k, where R/ik for i=1, . . . , k/R−1; Ti=R ln(R/δ)/k for i=k/R or Ti=0 for $$i = \frac{k}{R} + 1,$$

. . . , k; R=c ln(k/δ)√k, where c is constant and δ is a decoding error probability; and B=sum(Pi+Ti) is a normalization factor.

Additionally, a decodability threshold value, D (e.g., a decodable threshold), may be defined for encoding process 500 (e.g., using Luby Transform encoding). As long as a number of network encoded packets received at a receiver is greater than or equal to D, decoding of a message carried by the network encoded packets can be successful for the receiver.

Figure 6:
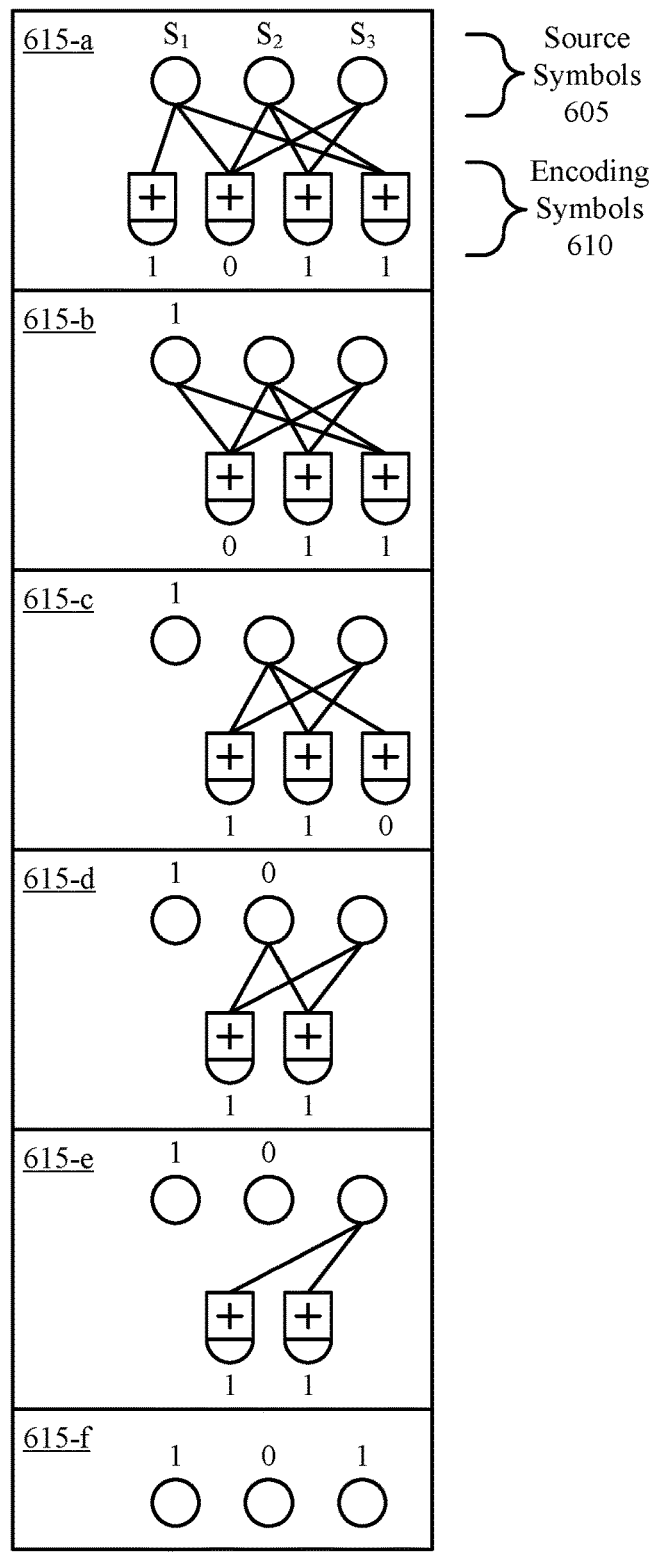
FIG. 6 illustrates an example of a decoding process in accordance with aspects of the present disclosure.

FIG. 6 illustrates an example of a decoding process 600 that supports feedback design for network coding termination in broadcasting in accordance with aspects of the present disclosure. In some examples, decoding process 600 may implement aspects of or may be implemented by aspects of wireless communications system 100, wireless communications system 200, or both. For example, decoding process 600 may represent a rateless code that can be used by a base station 105 and/or a UE 115 to decode a set of packets. In particular, decoding process 600 may represent a Luby transform code that a receiving device or decoder (e.g., a UE 115) then uses a belief propagation (BP) decoding process to identify a set of packets represented by encoded packets.

An encoder (e.g., the base station 105) may use an encoding process to transmit a set of source symbols 605 based on one or more encoding symbols 610. For example, the encoder may perform an encoding process for each encoding symbol 610, such as the encoding process 500 as described with reference to FIG. 5. In some cases, the encoding process may include the encoder randomly choosing a degree, $d_i$, from a degree distribution. Subsequently, the encoder may randomly choose $d_i$ distinct source symbols and XOR them.

A decoder (e.g., the UE 115) may then perform the decoding process 600 (e.g., BP algorithm) on received symbols from the encoder to determine the source symbols 605 that have been encoded. For example, the decoding process may include the decoder finding an encoding symbol 610 ($t_j$) that is connected to only one source symbol 605 ($s_j$). The decoding process may include different steps for determining this single connection between the encoding symbol 610 ($t_j$) and the source symbol 605 ($s_i$). In a first step, the decoder may set $s_i = t_j$. Subsequently, a second step may include the decoder XOR-ing $s_i$ to all encoding symbols 610 that are connected to $s_i$. Then, in a third step, the decoder may remove all the edges connected to the source symbol 605, $s_i$. The encoder may then repeat these steps until all $s_i$ are determined.

That is, the decoding process 600 may include a release step where all encoding symbols 610 of degree one (e.g., those encoding symbols 610 which are connected to one source symbol 605 or information symbol) may be released to cover their unique neighbor. Subsequently, the decoding process 600 may include a cover step where the released encoding symbols 610 cover their unique neighbor information symbols (e.g., source symbols 605). In this cover step, the covered but not processed input symbols may be sent to ripple, which is a set of covered unprocessed information symbols gathered through previous iterations. The decoding process 600 may then include a process step where one information symbol in the ripple (e.g., a source symbol 605) is chosen to be processed such that edges connecting the information symbol to its neighbor encoding symbols 610 are removed and the value of each encoding symbol 610 changes according to the information symbol. The processed information symbol may then be removed from the ripple.

As shown, at 615-a, the decoder may receive the source symbols 605 from the encoder and may determine the possible connections between the source symbols 605 and the encoding symbols 610. For example, the decoder may find the degree one element that is connected to $s_1$. At 615-b, the decoder may perform the first step as described herein to set $s_1=t_1$, such that $s_1=1$ (e.g., decode $s_1=1$) based on the single connection between $s_1$ and $t_1$. Subsequently, at 615-c, the decoder may perform the second and third steps as described herein to XOR $s_1$ to the encoding symbols connected to $s_1$ (e.g., XOR $t_2$ and XOR $t_4$, where $t_2$ and $t_4$ are the two encoding symbols connected to $s_1$ after the edges connected to $s_1$ have been removed), such that $t_2=1$ and $t_4=0$ after the XOR-ing. For example, the decoder may remove $s_1$ and update the received packets that $s_1$ was connected to.

At 615-d, the decoder may repeat the first step as described herein to set $s_2=t_4$, such that $s_2=0$ based on the single connection between $s_2$ and $t_4$ (e.g., see 615-c). For example, the decoder may find the degree one element that is connected to $s_2$ and remove the element. Subsequently, at 615-e, the decoder may perform the second and third steps as described herein to XOR $s_2$ to the encoding symbols connected to $s_2$ (e.g., 0 XOR $t_2$ and 0 XOR $t_3$, where $t_2$ and $t_3$ are the two encoding symbols connected to $s_2$ after the edges connected to $s_2$ have been removed), such that $t_2=1$ and $t_3=1$ still after the XOR-ing. For example, the decoder may decode that $s_2=0$ and may update the received packets that $s_2$ was connected to. At 615-f, the decoder may repeat the first step as described herein to $s_3=t_2=t_3$, such that $s_3=1$ based on the single connections between $s_3$ and $t_2$ and between $s_3$ and $t_3$ (e.g., see 615-e). For example, the decoder may find the degree one element that is connected to $s_3$ and may decode $s_3=1$. Accordingly, the decoder may then determine the source symbols 605 are {1 0 1} after performing the decoding process as described herein based on the Luby transform code (e.g., using a BP algorithm). Additionally or alternatively, the decoder may perform the decoding process using different algorithms with different complexities (e.g., gaussian elimination (GE) algorithm).

In some cases, the decoding process 600 may fail if at any step there is no degree one element for a given source symbol 605 or information symbol (e.g., each encoding symbol 610 has multiple connections to multiple source symbols 605). Accordingly, if the decoding process 600 fails, the decoder (e.g., receiver) may transmit an indication of the failed decoding process, such that the encoder may retransmit the set of network encoded symbols or may adjust one or more network coding parameters to enable the decoder to receive the source symbols 605.

Figure 7:
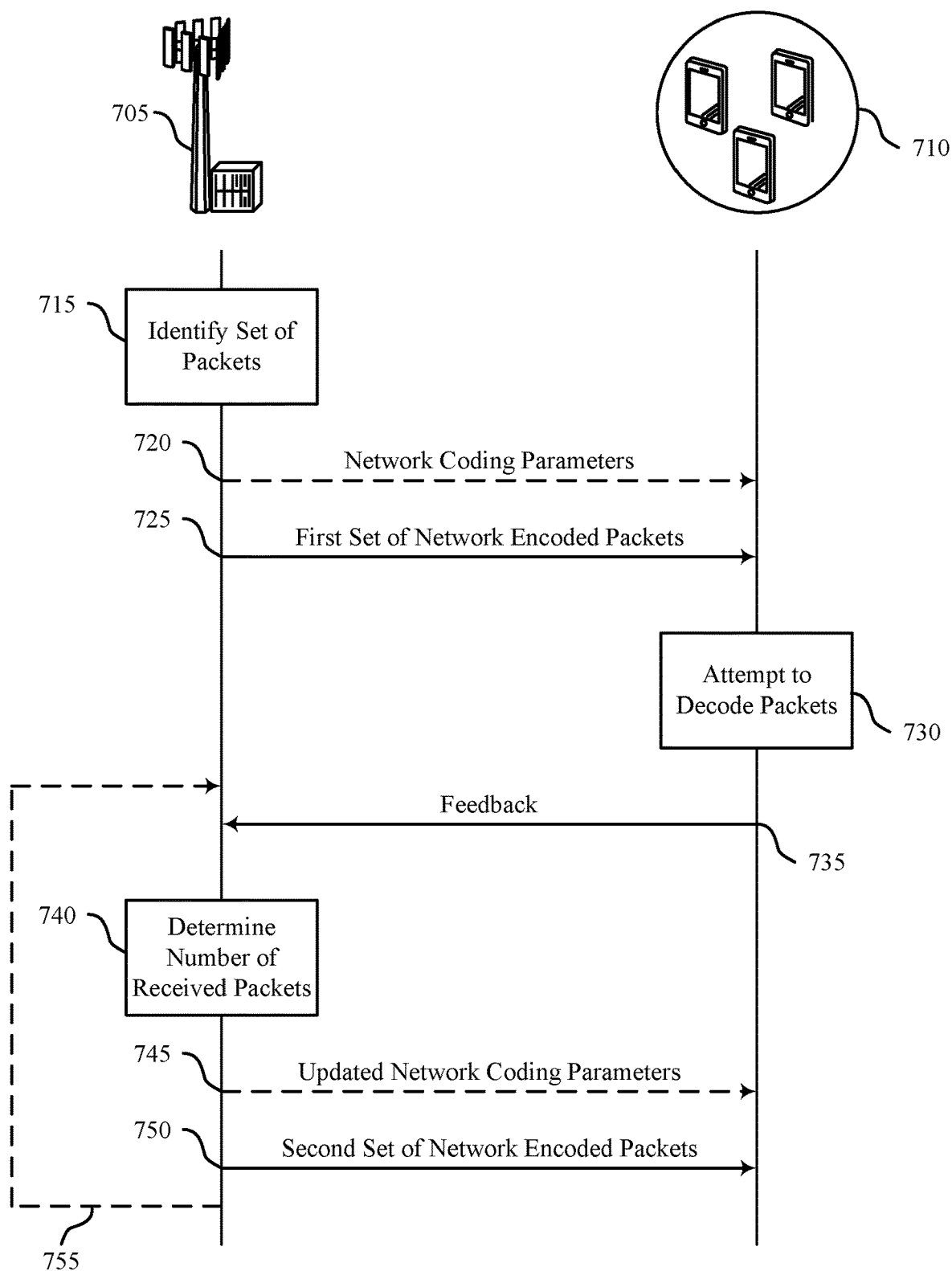
FIG. 7 illustrates an example of a process flow that supports feedback design for network coding termination in broadcasting in accordance with aspects of the present disclosure.

FIG. 7 illustrates an example of a process flow 700 that supports feedback design for network coding termination in broadcasting in accordance with aspects of the present disclosure. In some examples, process flow 700 may implement aspects of or may be implemented by aspects of wireless communications system 100, wireless communications system 200, or both. For example, process flow 700 may include a network device 705 (e.g., a base station 105) and a set of UEs 710 (e.g., multiple UEs 115) that represent corresponding devices as described with reference to FIGS. 1-6.

In the following description of the process flow 700, the operations between the network device 705 and the set of UEs 710 may be performed in different orders or at different times. Certain operations may also be left out of the process flow 700, or other operations may be added to the process flow 700. It is to be understood that while the network device 705 and the set of UEs 710 are shown performing a number of the operations of process flow 700, any wireless device may perform the operations shown.

At 715, the network device 705 (e.g., network node, network entity, base station 105, etc.) may identify a set of packets for broadcast to the set of UEs 710.

At 720, the network device 705 may transmit, to the set of UEs 710, one or more sets of network coding parameters to enable the set of UEs 710 to decode a set of network encoded packets for the set of packets. For example, the one or more sets of network coding parameters may each include network coding algorithms, an encoding function, an encoding matrix, a maximum number of decoding iterations, the decodability threshold value, or a combination thereof. Additionally, the network device 705 may transmit the one or more sets of network coding parameters to the set of UEs 710 via a MAC CE, DCI, RRC signaling (e.g., an RRC preconfiguration), or a combination thereof.

At 725, the network device 705 may transmit, to the set of UEs 710, a first set of network encoded packets based on the set of packets.

At 730, the set of UEs 710 may each attempt to decode the first set of network encoded packets.

At 735, the network device 705 may receive feedback from each of one or more UEs 115 of the set of UEs 710, the feedback indicating a number of successfully received packets of the first set of network encoded packets at each of the one or more UEs 115. For example, the network device 705 may receive the feedback from each of one or more UEs 115 of the set of UEs 710 via an RLC status report, a MAC HARQ acknowledgment message, or a combination thereof. In some implementations, the network device 705 may receive, from each of the one or more UEs 115 of the set of UEs 710, a number of missed packets of the first set of network encoded packets, where the number of successfully received packets is indicated based on the number of missed packets. Additionally or alternatively, the network device 705 may receive, from each of the one or more UEs 115 of the set of UEs 710, separate acknowledgment feedback indications for each packet in the first set of network encoded packets, where the number of successfully received packets is indicated based on the separate acknowledgment feedback indications.

At 740, the network device 705 may determine that the number of successfully received packets of the first set of network encoded packets fails to satisfy a decodability threshold value (e.g., the number of successfully received packets is less than the decodability threshold) for at least one of the one or more UEs 115. In some implementations, the network device 705 may store the number of successfully received packets for each of the one or more UEs 115, where the determining the number of successfully received packets fails to satisfy the decodability threshold value is based on the storing the number of successfully received packets.

In some cases, the network device 705 or at least one UE 115 of the set of UEs 710 may determine the at least one UE 115 is unable to recover the set of packets using a first set of network coding parameters of the one or more sets of network coding parameters. For example, the network device 705 may receive, from the at least one UE 115, a request for a different set of network coding parameters than the first set of network coding parameters, where the determining the at least one UE 115 is unable to recover the set of packets using the first set of network coding parameters is based on the request.

At 745, the network device 705 may transmit, to the at least one UE 115, an additional set of network coding parameters different than the first set of network coding parameters for the at least one UE 115 to decode the set of network encoded packets to recover the set of packets. In some cases, the additional set of network coding parameters may be a second set of network coding parameters from the one or more sets of network coding parameters or a separate set of network coding parameters than the one or more sets of network coding parameters.

At 750, the network device 705 may transmit, based on the determining that the number of successfully received packets of the first set of network encoded packets fails to satisfy the decodability threshold value for the at least one of the one or more UEs 115, a second set of network encoded packets selected from the set of packets. In some implementations, the network device 705 may transmit the second set of network encoded packets to a subset of the set of UEs 710 via respective unicast messages to each UE 115 in the subset, where the subset of the set of UEs 710 is determined based on the number of successfully received packets failing to satisfy the decodability threshold value for each UE 115 in the subset. Additionally, the network device 705 may determine a number of UEs 115 of the one or more of the set of UEs 115 have successfully received the set of packets based on the feedback from each of the one or more of the set of UEs 710, where the second set of network encoded packets are transmitted via the unicast messages based on the number of UEs 115 being less than a threshold. Alternatively, the network device 705 may transmit the second set of network encoded packets to the set of UEs 710 via a broadcast message.

At 755, the network device 705 may continue to transmit sets of network encoded packets and receive feedback from the set of UEs 710 until each UE 115 of the set of UEs 710 have successfully received the set of packets according to the decodability threshold value. Subsequently, once each UE 115 of the set of UEs 710 has successfully received the set of packets according to the decodability threshold value, the network device 705 may terminate the encoding process and stop transmitting sets of network encoded packets.

Figure 8:
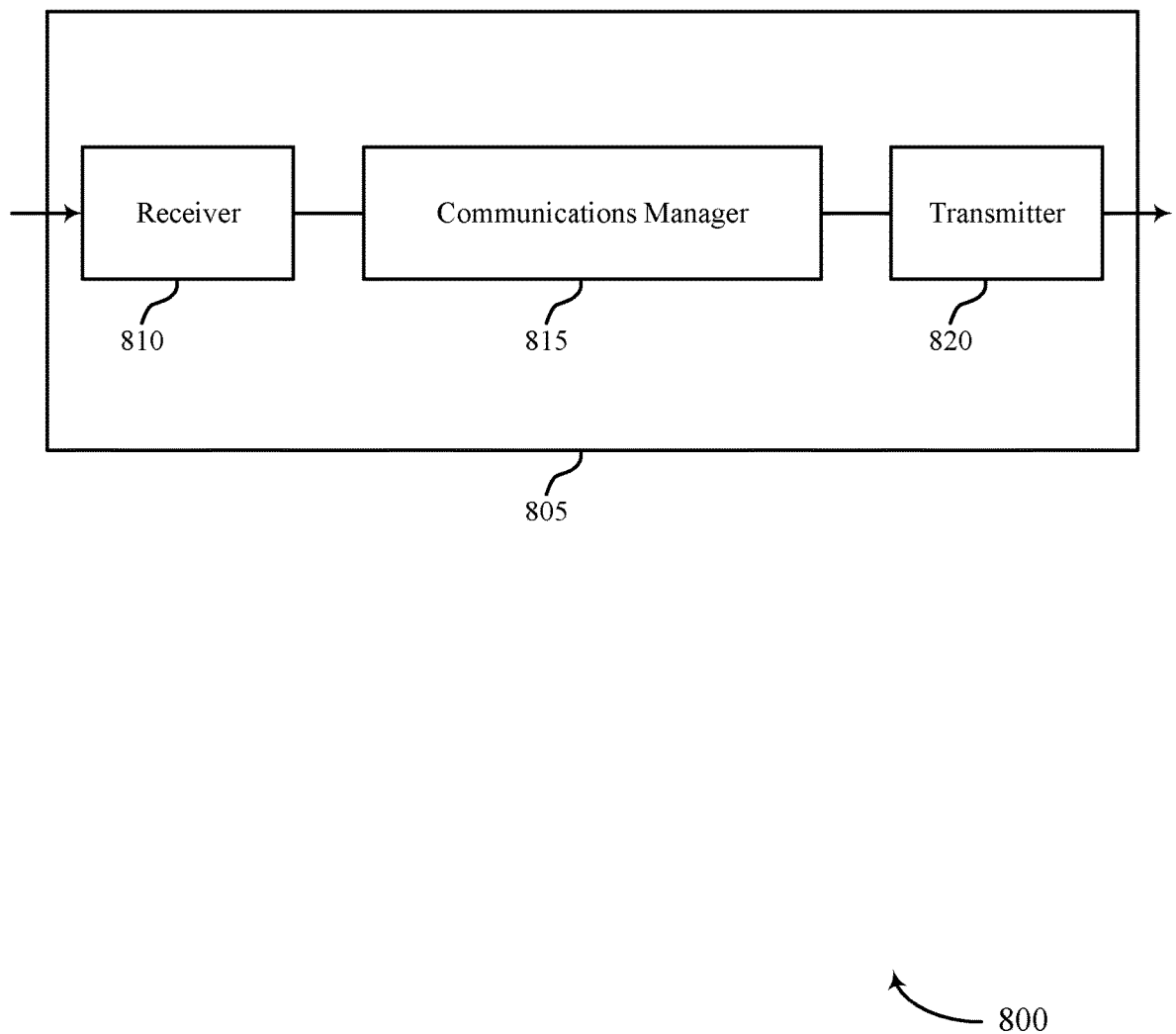
FIGS. 8 and 9 show block diagrams of devices that support feedback design for network coding termination in broadcasting in accordance with aspects of the present disclosure.

FIG. 8 shows a block diagram 800 of a device 805 that supports feedback design for network coding termination in broadcasting in accordance with aspects of the present disclosure. The device 805 may be an example of aspects of a UE 115 as described herein. The device 805 may include a receiver 810, a communications manager 815, and a transmitter 820. The device 805 may also include a processor. Each of these components may be in communication with one another (e.g., via one or more buses).

The receiver 810 may receive information such as packets, user data, or control information associated with various information channels (e.g., control channels, data channels, and information related to feedback design for network coding termination in broadcasting, etc.). Information may be passed on to other components of the device 805. The receiver 810 may be an example of aspects of the transceiver 1120 described with reference to FIG. 11. The receiver 810 may utilize a single antenna or a set of antennas.

The communications manager 815 may receive, from a network node, a first set of network encoded packets based on a set of packets. Additionally, the communications manager 815 may attempt to decode the first set of network encoded packets. Subsequently, the communications manager 815 may transmit, to the network node, feedback indicating a number of successfully received packets of the first set of network encoded packets resulting from the attempt to decode the first set of network encoded packets. The communications manager 815 may be an example of aspects of the communications manager 1110 described herein.

The communications manager 815, or its sub-components, may be implemented in hardware, code (e.g., software or firmware) executed by a processor, or any combination thereof. If implemented in code executed by a processor, the functions of the communications manager 815, or its sub-components may be executed by a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described in the present disclosure.

The communications manager 815, or its sub-components, may be physically located at various positions, including being distributed such that portions of functions are implemented at different physical locations by one or more physical components. In some examples, the communications manager 815, or its sub-components, may be a separate and distinct component in accordance with various aspects of the present disclosure. In some examples, the communications manager 815, or its sub-components, may be combined with one or more other hardware components, including but not limited to an input/output (I/O) component, a transceiver, a network server, another computing device, one or more other components described in the present disclosure, or a combination thereof in accordance with various aspects of the present disclosure.

In some examples, the communications manager 815 may be implemented as an integrated circuit or chipset for a mobile device modem, and the receiver 810 and transmitter 820 may be implemented as analog components (e.g., amplifiers, filters, antennas) coupled with the mobile device modem to enable wireless transmission and reception over one or more bands.

The communications manager 815 as described herein may be implemented to realize one or more potential advantages. One implementation may allow the device 805 to more efficiently indicate a number of missed packets without including extraneous information not needed by a network device for determining whether the device 805 has successfully received enough packets to enable decoding of a message. As such, the communications manager 815 may decrease signaling overhead for the device 805, thereby saving power and decreasing signaling complexity.

The transmitter 820 may transmit signals generated by other components of the device 805. In some examples, the transmitter 820 may be collocated with a receiver 810 in a transceiver module. For example, the transmitter 820 may be an example of aspects of the transceiver 1120 described with reference to FIG. 11. The transmitter 820 may utilize a single antenna or a set of antennas.

Figure 9:
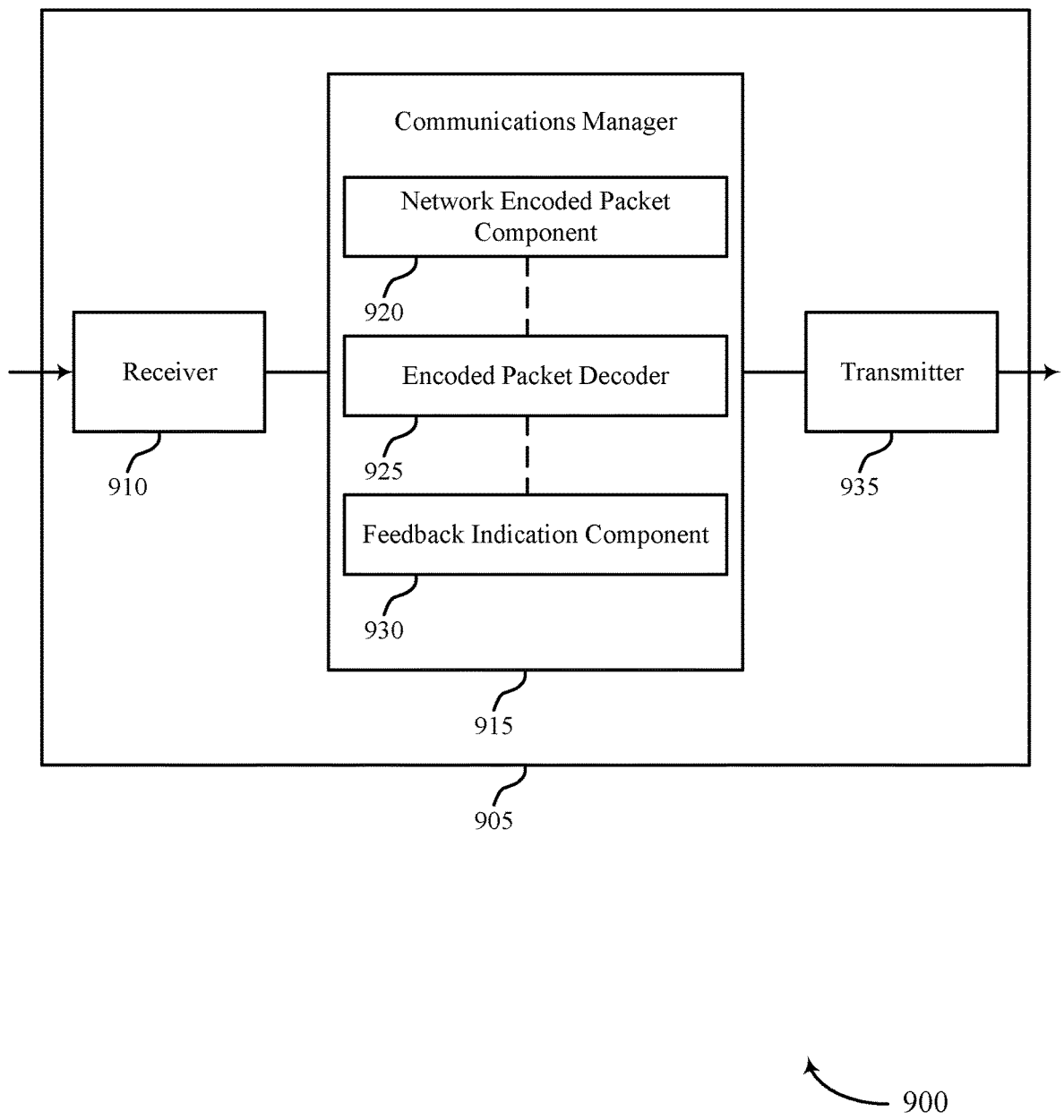

FIG. 9 shows a block diagram 900 of a device 905 that supports feedback design for network coding termination in broadcasting in accordance with aspects of the present disclosure. The device 905 may be an example of aspects of a device 805, or a UE 115 as described herein. The device 905 may include a receiver 910, a communications manager 915, and a transmitter 935. The device 905 may also include a processor. Each of these components may be in communication with one another (e.g., via one or more buses).

The receiver 910 may receive information such as packets, user data, or control information associated with various information channels (e.g., control channels, data channels, and information related to feedback design for network coding termination in broadcasting, etc.). Information may be passed on to other components of the device 905. The receiver 910 may be an example of aspects of the transceiver 1120 described with reference to FIG. 11. The receiver 910 may utilize a single antenna or a set of antennas.

The communications manager 915 may be an example of aspects of the communications manager 815 as described herein. The communications manager 915 may include a network encoded packet component 920, an encoded packet decoder 925, and a feedback indication component 930. The communications manager 915 may be an example of aspects of the communications manager 1110 described herein.

The network encoded packet component 920 may receive, from a network node, a first set of network encoded packets based on a set of packets.

The encoded packet decoder 925 may attempt to decode the first set of network encoded packets.

The feedback indication component 930 may transmit, to the network node, feedback indicating a number of successfully received packets of the first set of network encoded packets resulting from the attempt to decode the first set of network encoded packets.

Based on implementing the packet broadcasting techniques as described herein, a processor of a UE 115 (e.g., controlling the receiver 910, the transmitter 935, or the transceiver 1120 as described with reference to FIG. 11) may increase reliability and decrease signaling overhead due to the reduction of repeated transmission of packets and transmitting additional information not needed by a network device.

The transmitter 935 may transmit signals generated by other components of the device 905. In some examples, the transmitter 935 may be collocated with a receiver 910 in a transceiver module. For example, the transmitter 935 may be an example of aspects of the transceiver 1120 described with reference to FIG. 11. The transmitter 935 may utilize a single antenna or a set of antennas.

Figure 10:
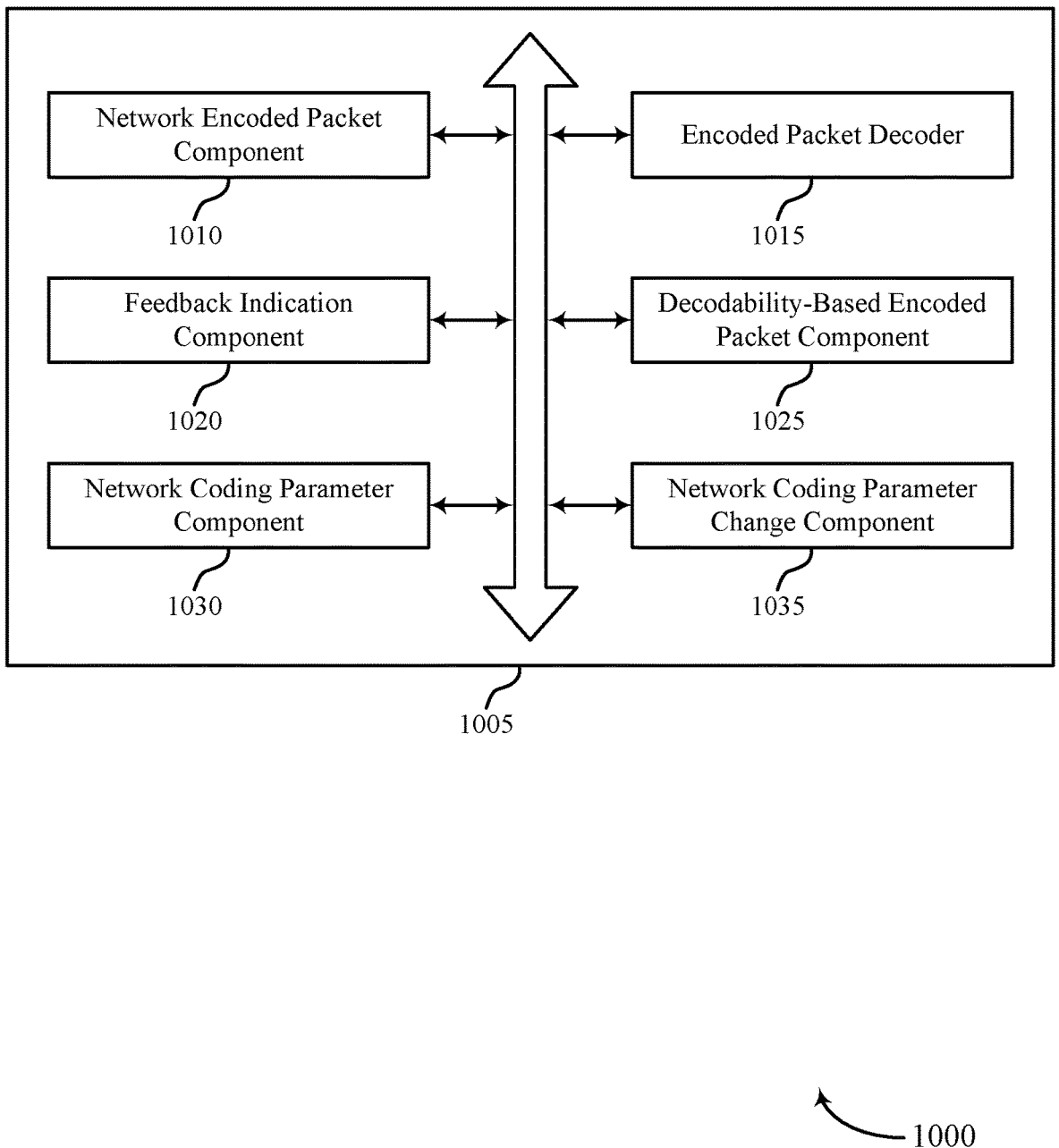
FIG. 10 shows a block diagram of a communications manager that supports feedback design for network coding termination in broadcasting in accordance with aspects of the present disclosure.

FIG. 10 shows a block diagram 1000 of a communications manager 1005 that supports feedback design for network coding termination in broadcasting in accordance with aspects of the present disclosure. The communications manager 1005 may be an example of aspects of a communications manager 815, a communications manager 915, or a communications manager 1110 described herein. The communications manager 1005 may include a network encoded packet component 1010, an encoded packet decoder 1015, a feedback indication component 1020, a decodability-based encoded packet component 1025, a network coding parameter component 1030, and a network coding parameter change component 1035. Each of these modules may communicate, directly or indirectly, with one another (e.g., via one or more buses).

The network encoded packet component 1010 may receive, from a network node, a first set of network encoded packets based on a set of packets.

The encoded packet decoder 1015 may attempt to decode the first set of network encoded packets.

The feedback indication component 1020 may transmit, to the network node, feedback indicating a number of successfully received packets of the first set of network encoded packets resulting from the attempt to decode the first set of network encoded packets. For example, the feedback indication component 1020 may transmit the feedback to the network node via a radio link control status report, a medium access control hybrid automatic repeat request acknowledgment message, or a combination thereof. In some examples, the feedback indication component 1020 may transmit, to the network node, a number of missed packets of the first set of network encoded packets, where the number of successfully received packets is indicated based on the number of missed packets. Additionally or alternatively, the feedback indication component 1020 may transmit, to the network node, separate acknowledgment feedback indications for each packet in the first set of network encoded packets, where the number of successfully received packets is indicated based on the separate acknowledgment feedback indications.

The decodability-based encoded packet component 1025 may receive, from the network node, a second set of network encoded packets based on the set of packets, where the second set of network encoded packets is received based on the number of successfully received packets of the first set of network encoded packets failing to satisfy a decodability threshold value. In some examples, the decodability-based encoded packet component 1025 may receive the second set of network encoded packets via a broadcast message or a unicast message from the network node.

The network coding parameter component 1030 may receive, from the network node, one or more sets of network coding parameters to enable a set of UEs to decode a set of network encoded packets for the set of packets, the set of UEs including the UE. In some examples, the network coding parameter component 1030 may determine to use a first set of network coding parameters from the one or more sets of network coding parameters for the attempting to decode the first set of network encoded packets. In some cases, the one or more sets of network coding parameters may each include network coding algorithms, an encoding function, an encoding matrix, a maximum number of decoding iterations, the decodability threshold value, or a combination thereof.

The network coding parameter change component 1035 may determine the first set of network coding parameters is insufficient for decoding the first set of network encoded packets to recover the set of packets. In some examples, the network coding parameter change component 1035 may transmit, to the network node, a request for a different set of network coding parameters based on the determining the first set of network coding parameters is insufficient. In some examples, the network coding parameter change component 1035 may receive, from the network node, an additional set of network coding parameters for decoding a subsequent transmission of a set of encoded packets for the set of packets. In some cases, the additional set of network coding parameters may be a second set of network coding parameters from the one or more sets of network coding parameters or a separate set of network coding parameters than the one or more sets of network coding parameters.

Figure 11:
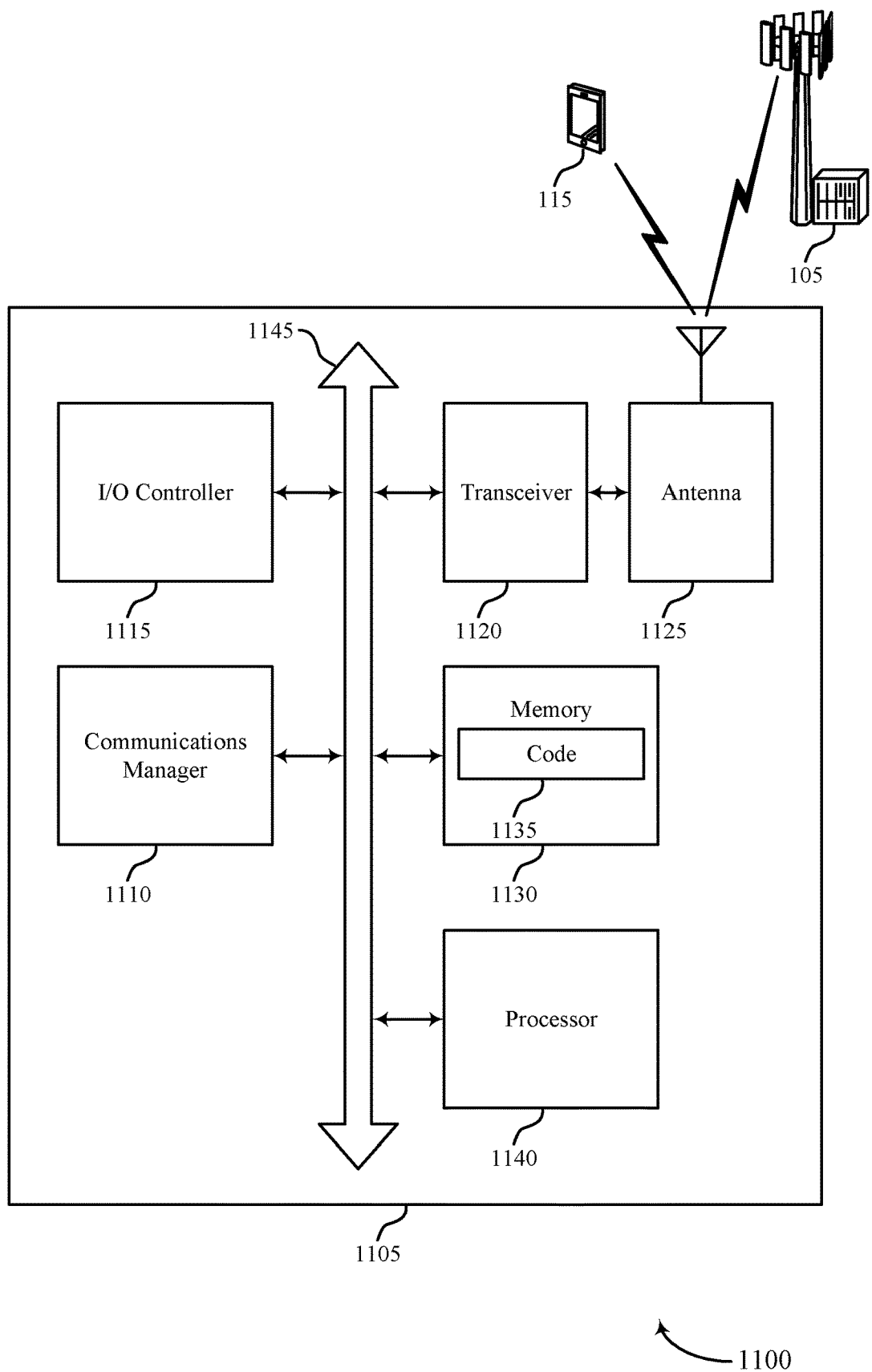
FIG. 11 shows a diagram of a system including a device that supports feedback design for network coding termination in broadcasting in accordance with aspects of the present disclosure.

FIG. 11 shows a diagram of a system 1100 including a device 1105 that supports feedback design for network coding termination in broadcasting in accordance with aspects of the present disclosure. The device 1105 may be an example of or include the components of device 805, device 905, or a UE 115 as described herein. The device 1105 may include components for bi-directional voice and data communications including components for transmitting and receiving communications, including a communications manager 1110, an I/O controller 1115, a transceiver 1120, an antenna 1125, memory 1130, and a processor 1140. These components may be in electronic communication via one or more buses (e.g., bus 1145).

The communications manager 1110 may receive, from a network node, a first set of network encoded packets based on a set of packets. Additionally, the communications manager 1110 may attempt to decode the first set of network encoded packets. Subsequently, the communications manager 1110 may transmit, to the network node, feedback indicating a number of successfully received packets of the first set of network encoded packets resulting from the attempt to decode the first set of network encoded packets.

The I/O controller 1115 may manage input and output signals for the device 1105. The I/O controller 1115 may also manage peripherals not integrated into the device 1105. In some cases, the I/O controller 1115 may represent a physical connection or port to an external peripheral. In some cases, the I/O controller 1115 may utilize an operating system such as iOS®, ANDROID®, MS-DOS®, MS-WINDOWS®, OS/2®, UNIX®, LINUX®, or another known operating system. In other cases, the I/O controller 1115 may represent or interact with a modem, a keyboard, a mouse, a touchscreen, or a similar device. In some cases, the I/O controller 1115 may be implemented as part of a processor. In some cases, a user may interact with the device 1105 via the I/O controller 1115 or via hardware components controlled by the I/O controller 1115.

The transceiver 1120 may communicate bi-directionally, via one or more antennas, wired, or wireless links as described herein. For example, the transceiver 1120 may represent a wireless transceiver and may communicate bi-directionally with another wireless transceiver. The transceiver 1120 may also include a modem to modulate the packets and provide the modulated packets to the antennas for transmission, and to demodulate packets received from the antennas.

In some cases, the wireless device may include a single antenna 1125. However, in some cases the device may have more than one antenna 1125, which may be capable of concurrently transmitting or receiving multiple wireless transmissions.

The memory 1130 may include random-access memory (RAM) and read-only memory (ROM). The memory 1130 may store computer-readable, computer-executable code 1135 including instructions that, when executed, cause the processor to perform various functions described herein. In some cases, the memory 1130 may contain, among other things, a basic I/O system (BIOS) which may control basic hardware or software operation such as the interaction with peripheral components or devices.

The processor 1140 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, the processor 1140 may be configured to operate a memory array using a memory controller. In other cases, a memory controller may be integrated into the processor 1140. The processor 1140 may be configured to execute computer-readable instructions stored in a memory (e.g., the memory 1130) to cause the device 1105 to perform various functions (e.g., functions or tasks supporting feedback design for network coding termination in broadcasting).

The code 1135 may include instructions to implement aspects of the present disclosure, including instructions to support wireless communications. The code 1135 may be stored in a non-transitory computer-readable medium such as system memory or other type of memory. In some cases, the code 1135 may not be directly executable by the processor 1140 but may cause a computer (e.g., when compiled and executed) to perform functions described herein.

Figure 12:
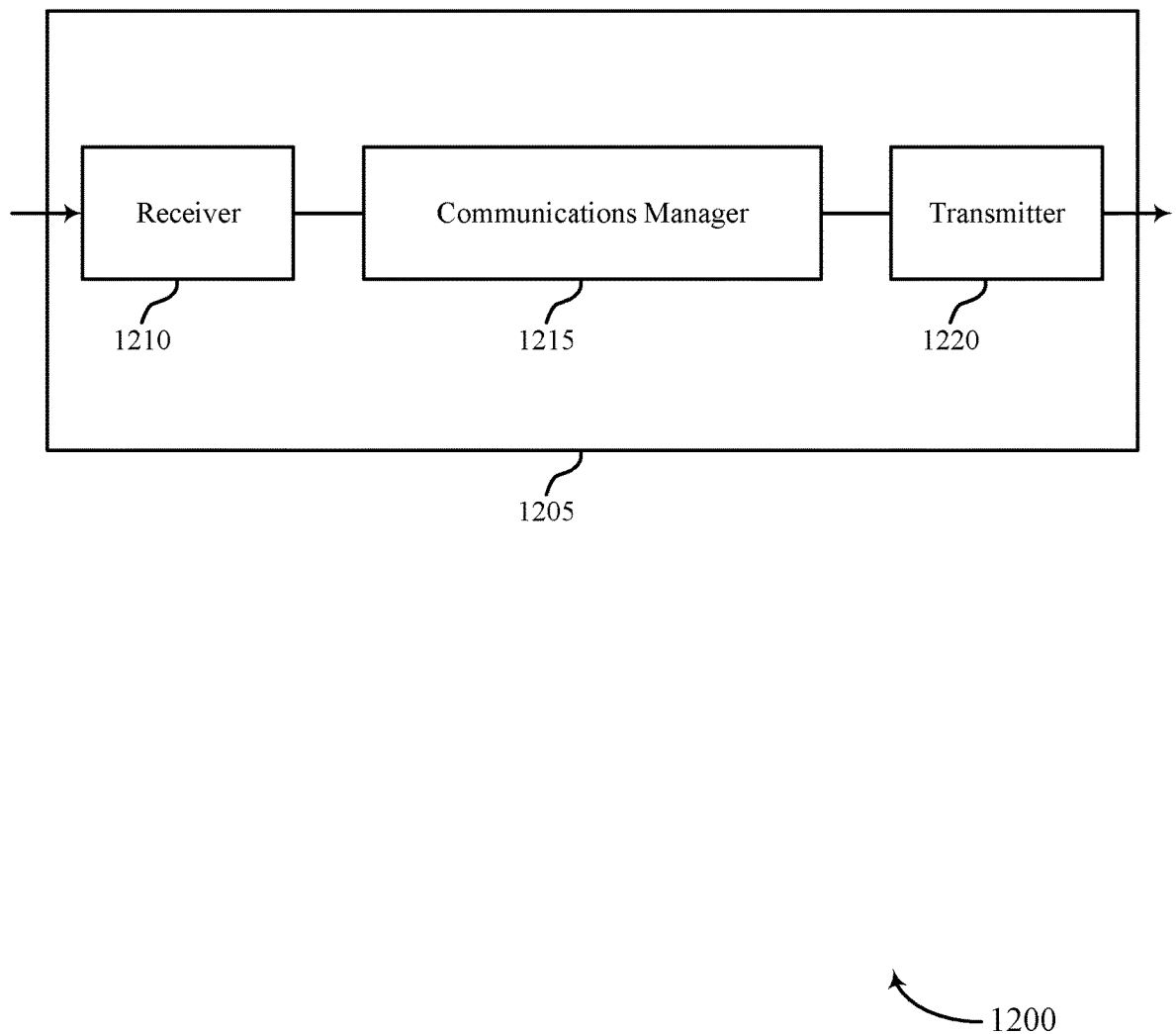
FIGS. 12 and 13 show block diagrams of devices that support feedback design for network coding termination in broadcasting in accordance with aspects of the present disclosure.

FIG. 12 shows a block diagram 1200 of a device 1205 that supports feedback design for network coding termination in broadcasting in accordance with aspects of the present disclosure. The device 1205 may be an example of aspects of a base station 105 as described herein. The device 1205 may include a receiver 1210, a communications manager 1215, and a transmitter 1220. The device 1205 may also include a processor. Each of these components may be in communication with one another (e.g., via one or more buses).

The receiver 1210 may receive information such as packets, user data, or control information associated with various information channels (e.g., control channels, data channels, and information related to feedback design for network coding termination in broadcasting, etc.). Information may be passed on to other components of the device 1205. The receiver 1210 may be an example of aspects of the transceiver 1520 described with reference to FIG. 15. The receiver 1210 may utilize a single antenna or a set of antennas.

The communications manager 1215 may identify, at the network node, a set of packets for broadcast to a set of UEs. In some cases, the communications manager 1215 may transmit, to the set of UEs, a first set of network encoded packets based on the set of packets. Subsequently, the communications manager 1215 may receive feedback from each of one or more of the set of UEs, the feedback indicating a number of successfully received packets of the first set of network encoded packets at each of the one or more UEs. The communications manager 1215 may then determine that the number of successfully received packets of the first set of network encoded packets fails to satisfy a decodability threshold value for at least one of the one or more UEs. Additionally, the communications manager 1215 may transmit, based on the determining, a second set of network encoded packets selected from the set of packets. The communications manager 1215 may be an example of aspects of the communications manager 1510 described herein.

The communications manager 1215, or its sub-components, may be implemented in hardware, code (e.g., software or firmware) executed by a processor, or any combination thereof. If implemented in code executed by a processor, the functions of the communications manager 1215, or its sub-components may be executed by a general-purpose processor, a DSP, an ASIC, an FPGA or other programmable logic device, discrete gate or transistor logic, discrete hardware components, or any combination thereof designed to perform the functions described in the present disclosure.

The communications manager 1215, or its sub-components, may be physically located at various positions, including being distributed such that portions of functions are implemented at different physical locations by one or more physical components. In some examples, the communications manager 1215, or its sub-components, may be a separate and distinct component in accordance with various aspects of the present disclosure. In some examples, the communications manager 1215, or its sub-components, may be combined with one or more other hardware components, including but not limited to an I/O component, a transceiver, a network server, another computing device, one or more other components described in the present disclosure, or a combination thereof in accordance with various aspects of the present disclosure.

The transmitter 1220 may transmit signals generated by other components of the device 1205. In some examples, the transmitter 1220 may be collocated with a receiver 1210 in a transceiver module. For example, the transmitter 1220 may be an example of aspects of the transceiver 1520 described with reference to FIG. 15. The transmitter 1220 may utilize a single antenna or a set of antennas.

Figure 13:
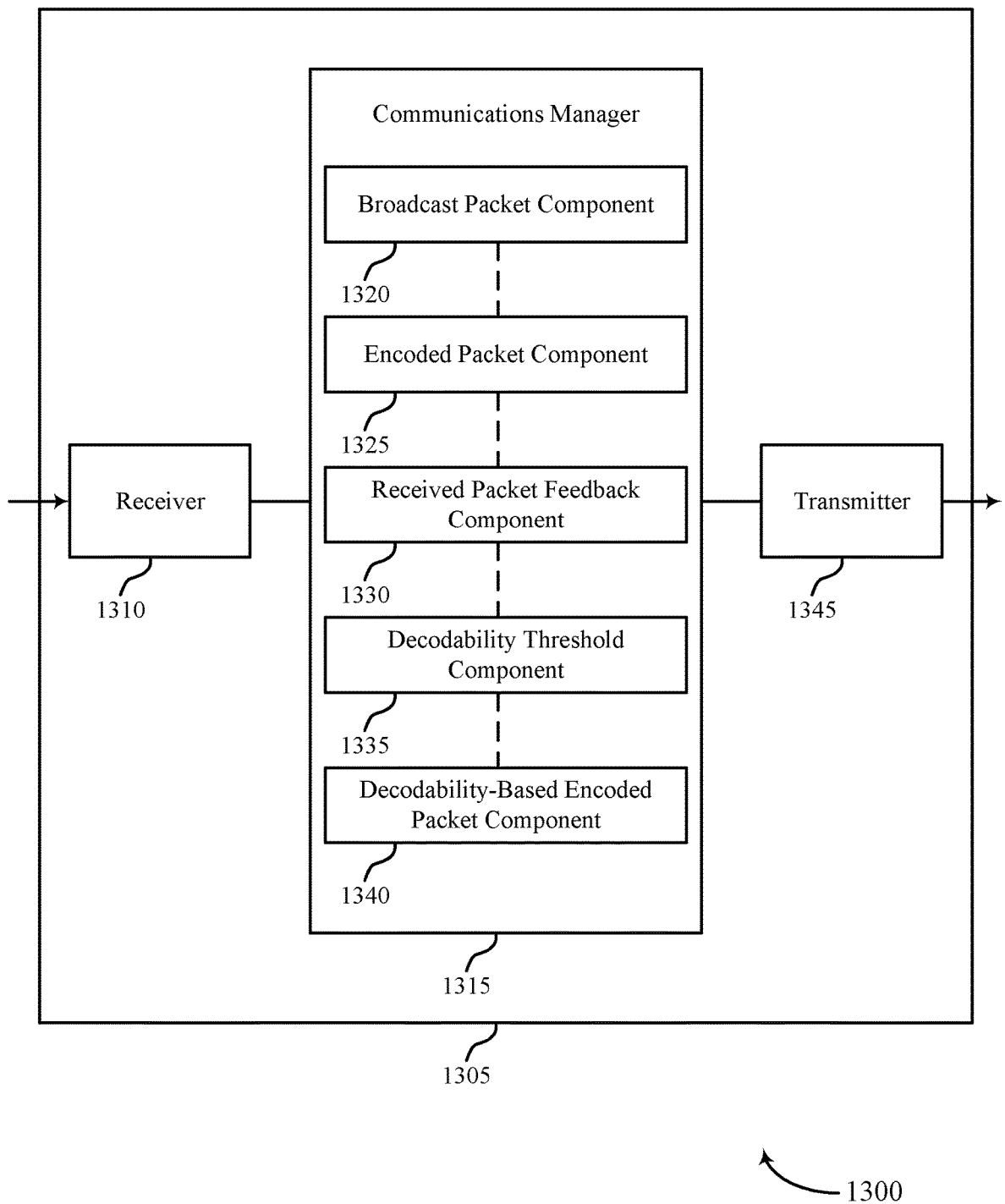

FIG. 13 shows a block diagram 1300 of a device 1305 that supports feedback design for network coding termination in broadcasting in accordance with aspects of the present disclosure. The device 1305 may be an example of aspects of a device 1205, or a base station 105 as described herein. The device 1305 may include a receiver 1310, a communications manager 1315, and a transmitter 1345. The device 1305 may also include a processor. Each of these components may be in communication with one another (e.g., via one or more buses).

The receiver 1310 may receive information such as packets, user data, or control information associated with various information channels (e.g., control channels, data channels, and information related to feedback design for network coding termination in broadcasting, etc.). Information may be passed on to other components of the device 1305. The receiver 1310 may be an example of aspects of the transceiver 1520 described with reference to FIG. 15. The receiver 1310 may utilize a single antenna or a set of antennas.

The communications manager 1315 may be an example of aspects of the communications manager 1215 as described herein. The communications manager 1315 may include a broadcast packet component 1320, an encoded packet component 1325, a received packet feedback component 1330, a decodability threshold component 1335, and a decodability-based encoded packet component 1340. The communications manager 1315 may be an example of aspects of the communications manager 1510 described herein.

The broadcast packet component 1320 may identify, at the network node, a set of packets for broadcast to a set of UEs.

The encoded packet component 1325 may transmit, to the set of UEs, a first set of network encoded packets based on the set of packets.

The received packet feedback component 1330 may receive feedback from each of one or more of the set of UEs, the feedback indicating a number of successfully received packets of the first set of network encoded packets at each of the one or more UEs.

The decodability threshold component 1335 may determine that the number of successfully received packets of the first set of network encoded packets fails to satisfy a decodability threshold value for at least one of the one or more UEs.

The decodability-based encoded packet component 1340 may transmit, based on the determining, a second set of network encoded packets selected from the set of packets.

The transmitter 1345 may transmit signals generated by other components of the device 1305. In some examples, the transmitter 1345 may be collocated with a receiver 1310 in a transceiver module. For example, the transmitter 1345 may be an example of aspects of the transceiver 1520 described with reference to FIG. 15. The transmitter 1345 may utilize a single antenna or a set of antennas.

Figure 14:
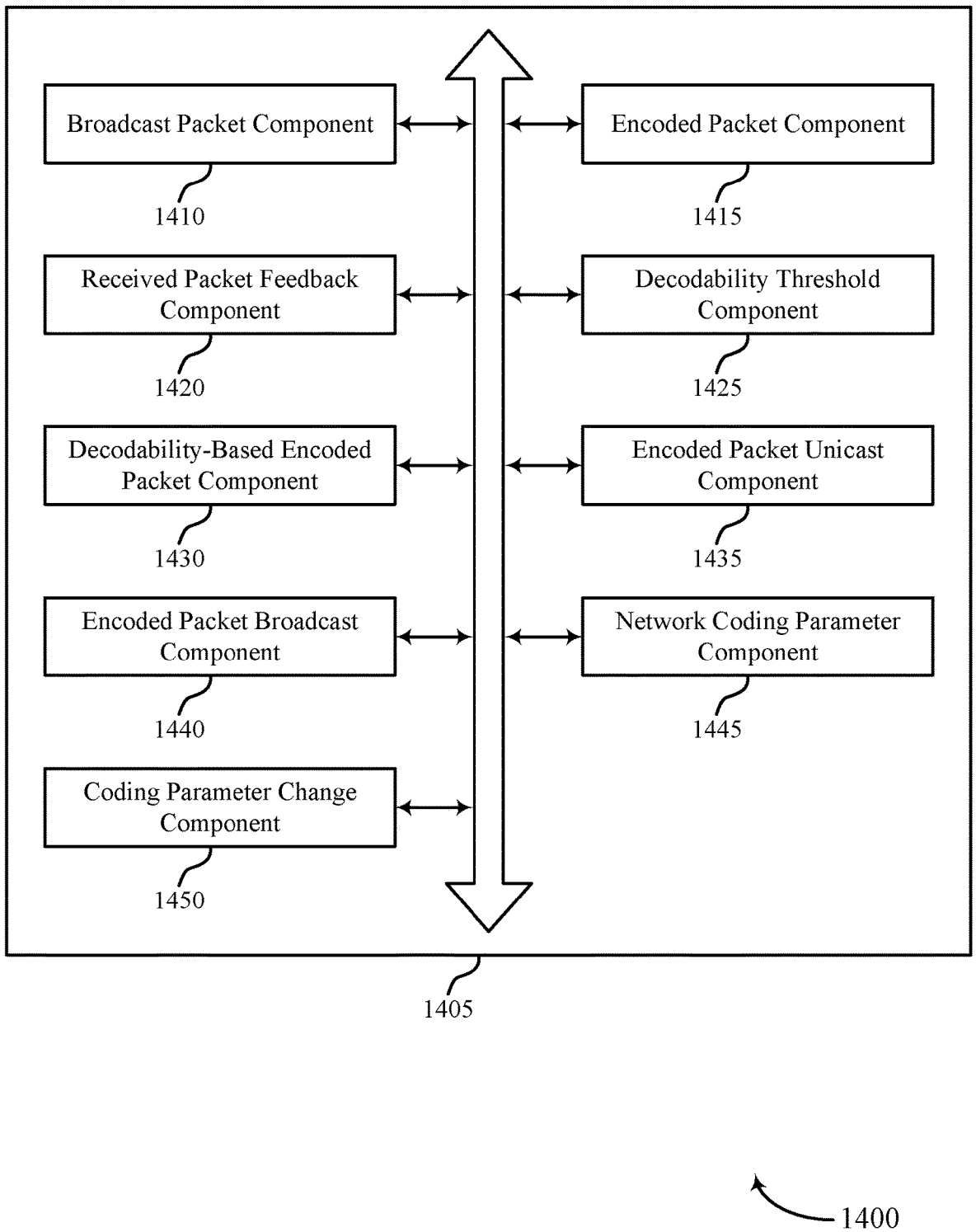
FIG. 14 shows a block diagram of a communications manager that supports feedback design for network coding termination in broadcasting in accordance with aspects of the present disclosure.

FIG. 14 shows a block diagram 1400 of a communications manager 1405 that supports feedback design for network coding termination in broadcasting in accordance with aspects of the present disclosure. The communications manager 1405 may be an example of aspects of a communications manager 1215, a communications manager 1315, or a communications manager 1510 described herein. The communications manager 1405 may include a broadcast packet component 1410, an encoded packet component 1415, a received packet feedback component 1420, a decodability threshold component 1425, a decodability-based encoded packet component 1430, an encoded packet unicast component 1435, an encoded packet broadcast component 1440, a network coding parameter component 1445, and a coding parameter change component 1450. Each of these modules may communicate, directly or indirectly, with one another (e.g., via one or more buses).

The broadcast packet component 1410 may identify, at the network node, a set of packets for broadcast to a set of UEs.

The encoded packet component 1415 may transmit, to the set of UEs, a first set of network encoded packets based on the set of packets.

The received packet feedback component 1420 may receive feedback from each of one or more of the set of UEs, the feedback indicating a number of successfully received packets of the first set of network encoded packets at each of the one or more UEs. For example, the received packet feedback component 1420 may receive the feedback from each of one or more of the set of UEs via a radio link control status report, a medium access control hybrid automatic repeat request acknowledgment message, or a combination thereof. In some examples, the received packet feedback component 1420 may receive, from each of the one or more of the set of UEs, a number of missed packets of the first set of network encoded packets, where the number of successfully received packets is indicated based on the number of missed packets. In some examples, the received packet feedback component 1420 may receive, from each of the one or more of the set of UEs, separate acknowledgment feedback indications for each packet in the first set of network encoded packets, where the number of successfully received packets is indicated based on the separate acknowledgment feedback indications.

The decodability threshold component 1425 may determine that the number of successfully received packets of the first set of network encoded packets fails to satisfy a decodability threshold value for at least one of the one or more UEs. In some examples, the decodability threshold component 1425 may store the number of successfully received packets for each of the one or more UEs, where the determining the number of successfully received packets fails to satisfy the decodability threshold value is based on the storing the number of successfully received packets.

The decodability-based encoded packet component 1430 may transmit, based on the determining, a second set of network encoded packets selected from the set of packets.

The encoded packet unicast component 1435 may transmit the second set of network encoded packets to a subset of the set of UEs via respective unicast messages to each UE in the subset, where the subset of the set of UEs is determined based on the number of successfully received packets failing to satisfy the decodability threshold value for each UE in the subset. In some examples, the encoded packet unicast component 1435 may determine a number of UEs of the one or more of the set of UEs have successfully received the set of packets based on the feedback from each of the one or more of the set of UEs, where the second set of network encoded packets are transmitted via the unicast messages based on the number of UEs being less than a threshold.

The encoded packet broadcast component 1440 may transmit the second set of network encoded packets to the set of UEs via a broadcast message.

The network coding parameter component 1445 may transmit, to the set of UEs, one or more sets of network coding parameters to enable the set of UEs to decode a set of network encoded packets for the set of packets.

In some examples, the network coding parameter component 1445 may transmit the one or more sets of network coding parameters to the set of UEs via a MAC CE, DCI, RRC signaling, or a combination thereof. In some cases, the one or more sets of network coding parameters may each include network coding algorithms, an encoding function, an encoding matrix, a maximum number of decoding iterations, the decodability threshold value, or a combination thereof.

The coding parameter change component 1450 may determine at least one UE of the set of UEs is unable to recover the set of packets using a first set of network coding parameters of the one or more sets of network coding parameters. In some examples, the coding parameter change component 1450 may transmit, to the at least one UE, an additional set of network coding parameters different than the first set of network coding parameters for the at least one UE to decode the set of network encoded packets to recover the set of packets. In some examples, the coding parameter change component 1450 may receive, from the at least one UE, a request for a different set of network coding parameters than the first set of network coding parameters, where the determining the at least one UE is unable to recover the set of packets using the first set of network coding parameters is based on the request. In some cases, the additional set of network coding parameters may be a second set of network coding parameters from the one or more sets of network coding parameters or a separate set of network coding parameters than the one or more sets of network coding parameters.

Figure 15:
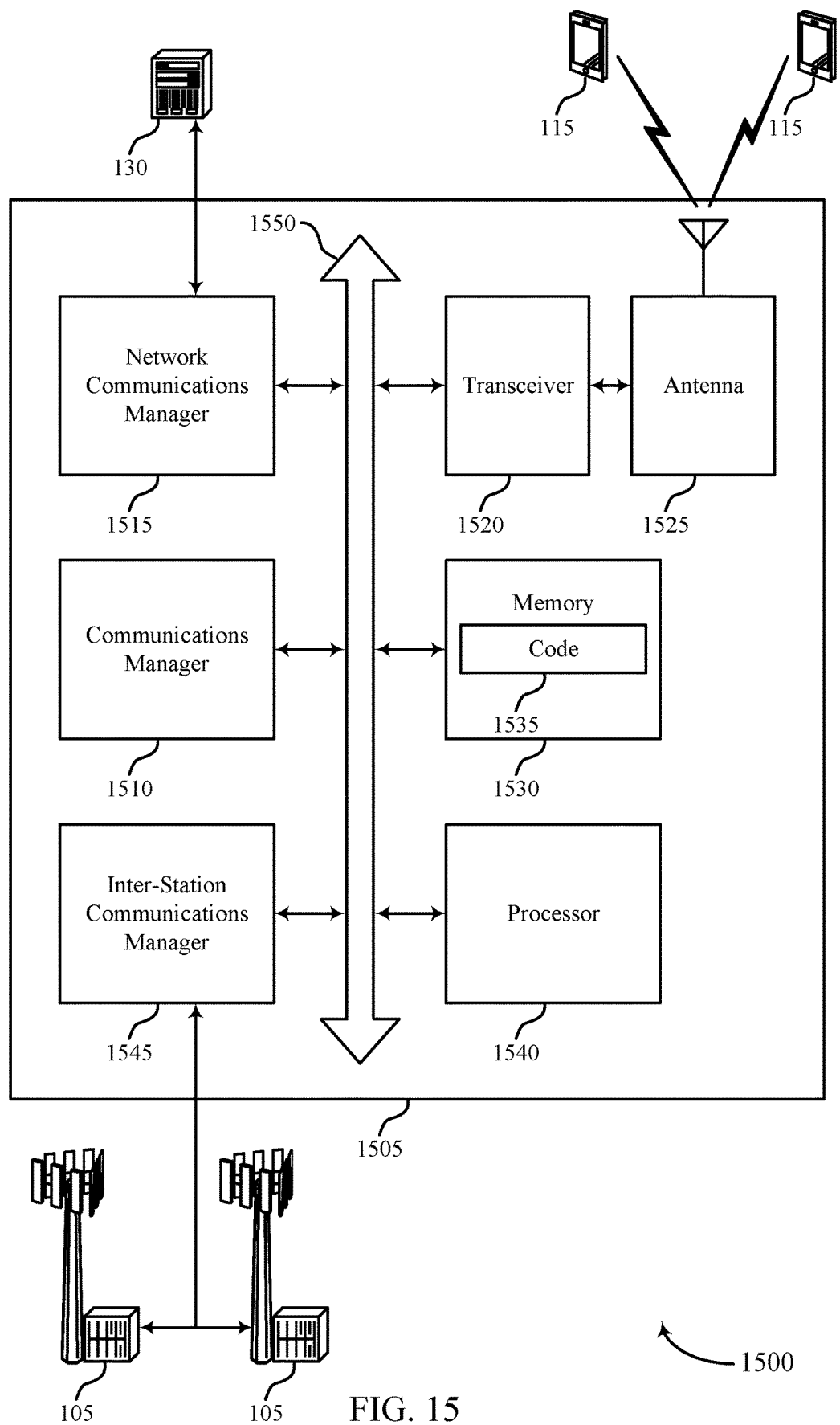
FIG. 15 shows a diagram of a system including a device that supports feedback design for network coding termination in broadcasting in accordance with aspects of the present disclosure.

FIG. 15 shows a diagram of a system 1500 including a device 1505 that supports feedback design for network coding termination in broadcasting in accordance with aspects of the present disclosure. The device 1505 may be an example of or include the components of device 1205, device 1305, or a base station 105 as described herein. The device 1505 may include components for bi-directional voice and data communications including components for transmitting and receiving communications, including a communications manager 1510, a network communications manager 1515, a transceiver 1520, an antenna 1525, memory 1530, a processor 1540, and an inter-station communications manager 1545. These components may be in electronic communication via one or more buses (e.g., bus 1550).

The communications manager 1510 may identify, at the network node, a set of packets for broadcast to a set of UEs. In some cases, the communications manager 1510 may transmit, to the set of UEs, a first set of network encoded packets based on the set of packets. Subsequently, the communications manager 1510 may receive feedback from each of one or more of the set of UEs, the feedback indicating a number of successfully received packets of the first set of network encoded packets at each of the one or more UEs. The communications manager 1510 may then determine that the number of successfully received packets of the first set of network encoded packets fails to satisfy a decodability threshold value for at least one of the one or more UEs. Additionally, the communications manager 1510 may transmit, based on the determining, a second set of network encoded packets selected from the set of packets.

The network communications manager 1515 may manage communications with the core network (e.g., via one or more wired backhaul links). For example, the network communications manager 1515 may manage the transfer of data communications for client devices, such as one or more UEs 115.

The transceiver 1520 may communicate bi-directionally, via one or more antennas, wired, or wireless links as described herein. For example, the transceiver 1520 may represent a wireless transceiver and may communicate bi-directionally with another wireless transceiver. The transceiver 1520 may also include a modem to modulate the packets and provide the modulated packets to the antennas for transmission, and to demodulate packets received from the antennas.

In some cases, the wireless device may include a single antenna 1525. However, in some cases the device may have more than one antenna 1525, which may be capable of concurrently transmitting or receiving multiple wireless transmissions.

The memory 1530 may include RAM, ROM, or a combination thereof. The memory 1530 may store computer-readable code 1535 including instructions that, when executed by a processor (e.g., the processor 1540) cause the device to perform various functions described herein. In some cases, the memory 1530 may contain, among other things, a BIOS which may control basic hardware or software operation such as the interaction with peripheral components or devices.

The processor 1540 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 1540 may be configured to operate a memory array using a memory controller. In some cases, a memory controller may be integrated into processor 1540. The processor 1540 may be configured to execute computer-readable instructions stored in a memory (e.g., the memory 1530) to cause the device 1505 to perform various functions (e.g., functions or tasks supporting feedback design for network coding termination in broadcasting).

The inter-station communications manager 1545 may manage communications with other base station 105 and may include a controller or scheduler for controlling communications with UEs 115 in cooperation with other base stations 105. For example, the inter-station communications manager 1545 may coordinate scheduling for transmissions to UEs 115 for various interference mitigation techniques such as beamforming or joint transmission. In some examples, the inter-station communications manager 1545 may provide an X2 interface within an LTE/LTE-A wireless communication network technology to provide communication between base stations 105.

The code 1535 may include instructions to implement aspects of the present disclosure, including instructions to support wireless communications. The code 1535 may be stored in a non-transitory computer-readable medium such as system memory or other type of memory. In some cases, the code 1535 may not be directly executable by the processor 1540 but may cause a computer (e.g., when compiled and executed) to perform functions described herein.

Figure 16:
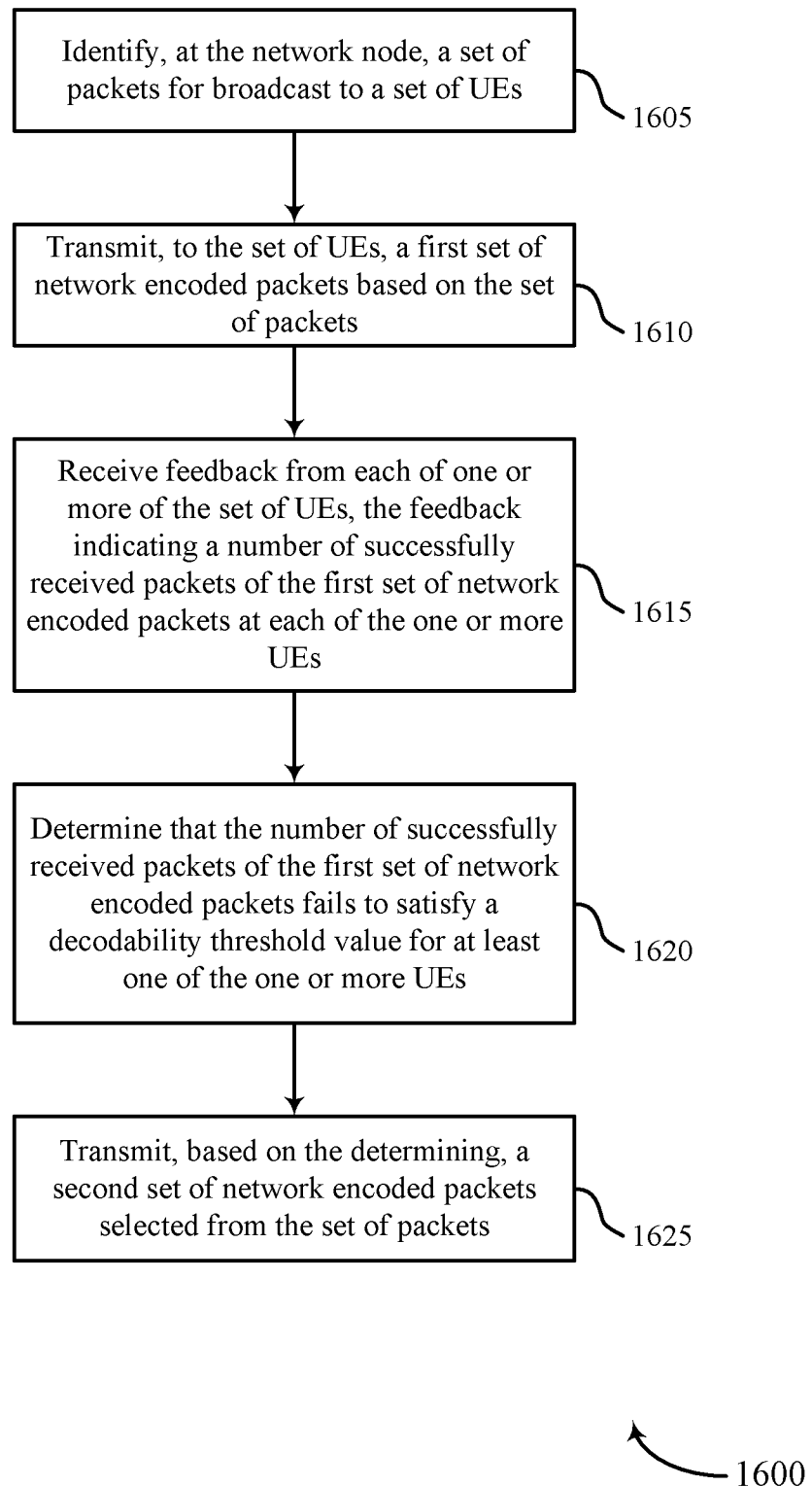
FIGS. 16 through 21 show flowcharts illustrating methods that support feedback design for network coding termination in broadcasting in accordance with aspects of the present disclosure.

FIG. 16 shows a flowchart illustrating a method 1600 that supports feedback design for network coding termination in broadcasting in accordance with aspects of the present disclosure. The operations of method 1600 may be implemented by a base station 105 or its components as described herein. For example, the operations of method 1600 may be performed by a communications manager as described with reference to FIGS. 12 through 15. In some examples, a base station may execute a set of instructions to control the functional elements of the base station to perform the functions described below. Additionally or alternatively, a base station may perform aspects of the functions described below using special-purpose hardware.

At 1605, the base station may identify, at the network node, a set of packets for broadcast to a set of UEs. The operations of 1605 may be performed according to the methods described herein. In some examples, aspects of the operations of 1605 may be performed by a broadcast packet component as described with reference to FIGS. 12 through 15.

At 1610, the base station may transmit, to the set of UEs, a first set of network encoded packets based on the set of packets. The operations of 1610 may be performed according to the methods described herein. In some examples, aspects of the operations of 1610 may be performed by an encoded packet component as described with reference to FIGS. 12 through 15.

At 1615, the base station may receive feedback from each of one or more of the set of UEs, the feedback indicating a number of successfully received packets of the first set of network encoded packets at each of the one or more UEs. The operations of 1615 may be performed according to the methods described herein. In some examples, aspects of the operations of 1615 may be performed by a received packet feedback component as described with reference to FIGS. 12 through 15.

At 1620, the base station may determine that the number of successfully received packets of the first set of network encoded packets fails to satisfy a decodability threshold value for at least one of the one or more UEs. The operations of 1620 may be performed according to the methods described herein. In some examples, aspects of the operations of 1620 may be performed by a decodability threshold component as described with reference to FIGS. 12 through 15.

At 1625, the base station may transmit, based on the determining, a second set of network encoded packets selected from the set of packets. The operations of 1625 may be performed according to the methods described herein. In some examples, aspects of the operations of 1625 may be performed by a decodability-based encoded packet component as described with reference to FIGS. 12 through 15.

Figure 17:
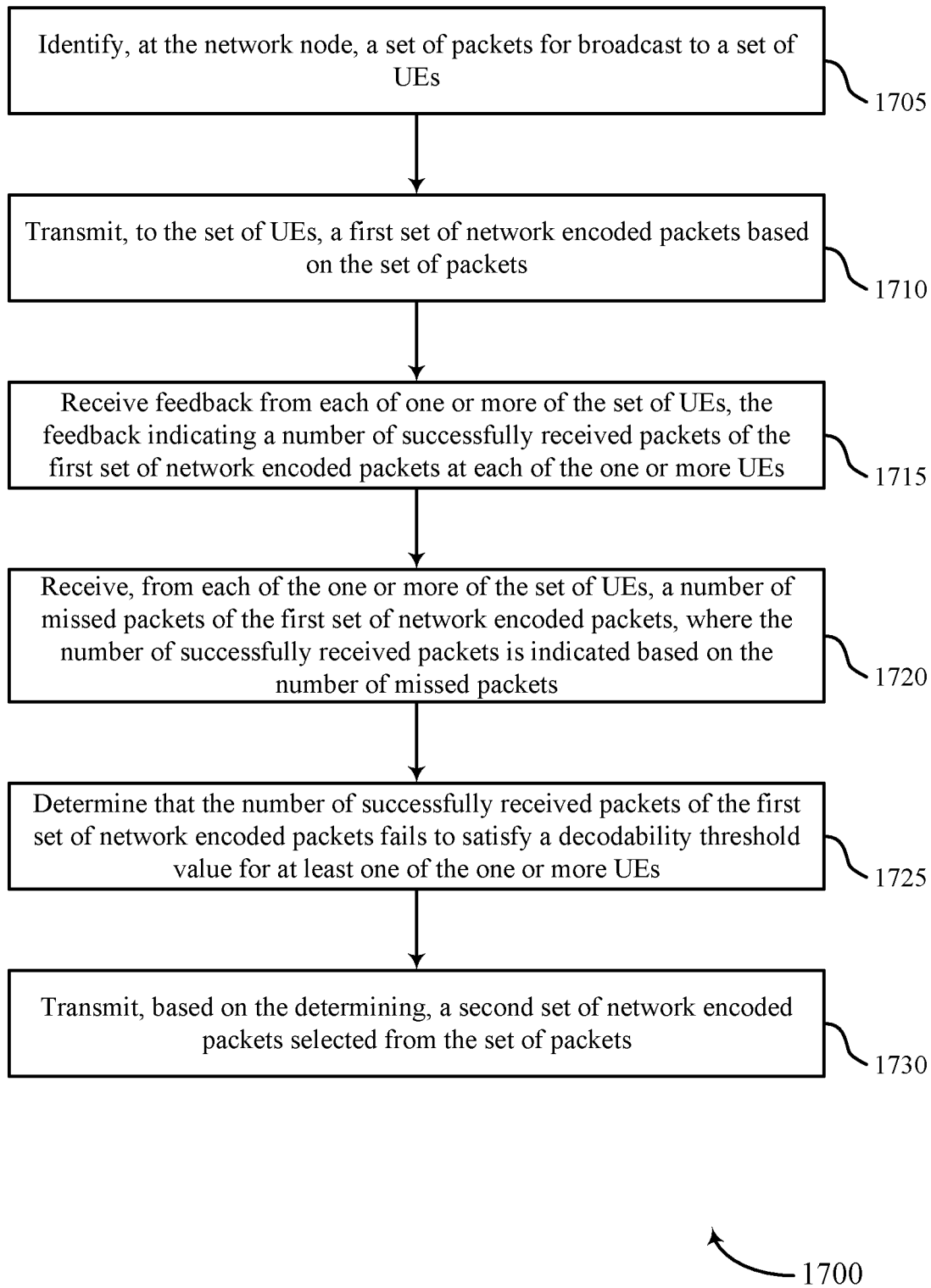

FIG. 17 shows a flowchart illustrating a method 1700 that supports feedback design for network coding termination in broadcasting in accordance with aspects of the present disclosure. The operations of method 1700 may be implemented by a base station 105 or its components as described herein. For example, the operations of method 1700 may be performed by a communications manager as described with reference to FIGS. 12 through 15. In some examples, a base station may execute a set of instructions to control the functional elements of the base station to perform the functions described below. Additionally or alternatively, a base station may perform aspects of the functions described below using special-purpose hardware.

At 1705, the base station may identify, at the network node, a set of packets for broadcast to a set of UEs. The operations of 1705 may be performed according to the methods described herein. In some examples, aspects of the operations of 1705 may be performed by a broadcast packet component as described with reference to FIGS. 12 through 15.

At 1710, the base station may transmit, to the set of UEs, a first set of network encoded packets based on the set of packets. The operations of 1710 may be performed according to the methods described herein. In some examples, aspects of the operations of 1710 may be performed by an encoded packet component as described with reference to FIGS. 12 through 15.

At 1715, the base station may receive feedback from each of one or more of the set of UEs, the feedback indicating a number of successfully received packets of the first set of network encoded packets at each of the one or more UEs. The operations of 1715 may be performed according to the methods described herein. In some examples, aspects of the operations of 1715 may be performed by a received packet feedback component as described with reference to FIGS. 12 through 15.

At 1720, the base station may receive, from each of the one or more of the set of UEs, a number of missed packets of the first set of network encoded packets, where the number of successfully received packets is indicated based on the number of missed packets. The operations of 1720 may be performed according to the methods described herein. In some examples, aspects of the operations of 1720 may be performed by a received packet feedback component as described with reference to FIGS. 12 through 15.

At 1725, the base station may determine that the number of successfully received packets of the first set of network encoded packets fails to satisfy a decodability threshold value for at least one of the one or more UEs. The operations of 1725 may be performed according to the methods described herein. In some examples, aspects of the operations of 1725 may be performed by a decodability threshold component as described with reference to FIGS. 12 through 15.

At 1730, the base station may transmit, based on the determining, a second set of network encoded packets selected from the set of packets. The operations of 1730 may be performed according to the methods described herein. In some examples, aspects of the operations of 1730 may be performed by a decodability-based encoded packet component as described with reference to FIGS. 12 through 15.

Figure 18:
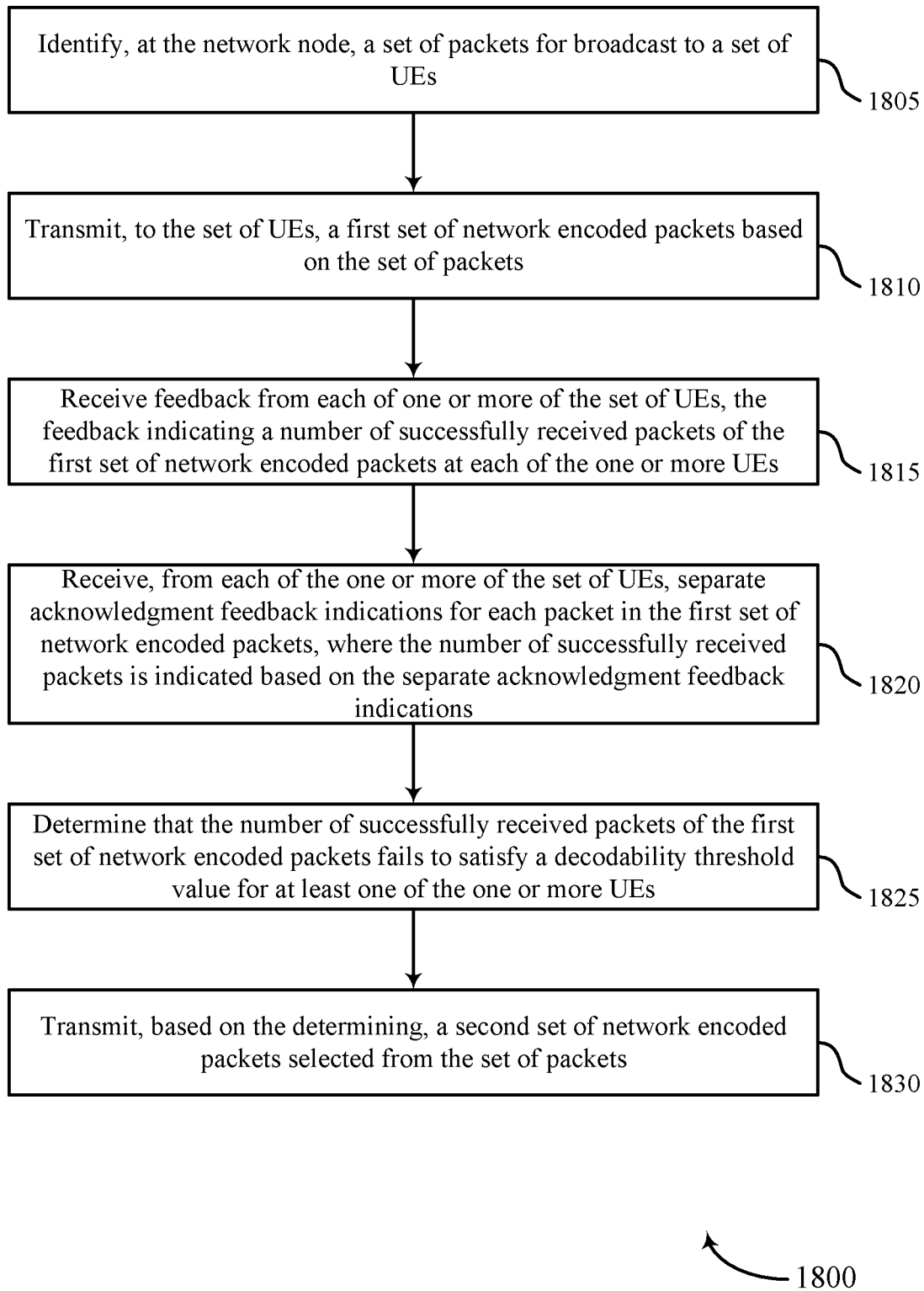

FIG. 18 shows a flowchart illustrating a method 1800 that supports feedback design for network coding termination in broadcasting in accordance with aspects of the present disclosure. The operations of method 1800 may be implemented by a base station 105 or its components as described herein. For example, the operations of method 1800 may be performed by a communications manager as described with reference to FIGS. 12 through 15. In some examples, a base station may execute a set of instructions to control the functional elements of the base station to perform the functions described below. Additionally or alternatively, a base station may perform aspects of the functions described below using special-purpose hardware.

At 1805, the base station may identify, at the network node, a set of packets for broadcast to a set of UEs. The operations of 1805 may be performed according to the methods described herein. In some examples, aspects of the operations of 1805 may be performed by a broadcast packet component as described with reference to FIGS. 12 through 15.

At 1810, the base station may transmit, to the set of UEs, a first set of network encoded packets based on the set of packets. The operations of 1810 may be performed according to the methods described herein. In some examples, aspects of the operations of 1810 may be performed by an encoded packet component as described with reference to FIGS. 12 through 15.

At 1815, the base station may receive feedback from each of one or more of the set of UEs, the feedback indicating a number of successfully received packets of the first set of network encoded packets at each of the one or more UEs. The operations of 1815 may be performed according to the methods described herein. In some examples, aspects of the operations of 1815 may be performed by a received packet feedback component as described with reference to FIGS. 12 through 15.

At 1820, the base station may receive, from each of the one or more of the set of UEs, separate acknowledgment feedback indications for each packet in the first set of network encoded packets, where the number of successfully received packets is indicated based on the separate acknowledgment feedback indications. The operations of 1820 may be performed according to the methods described herein. In some examples, aspects of the operations of 1820 may be performed by a received packet feedback component as described with reference to FIGS. 12 through 15.

At 1825, the base station may determine that the number of successfully received packets of the first set of network encoded packets fails to satisfy a decodability threshold value for at least one of the one or more UEs. The operations of 1825 may be performed according to the methods described herein. In some examples, aspects of the operations of 1825 may be performed by a decodability threshold component as described with reference to FIGS. 12 through 15.

At 1830, the base station may transmit, based on the determining, a second set of network encoded packets selected from the set of packets. The operations of 1830 may be performed according to the methods described herein. In some examples, aspects of the operations of 1830 may be performed by a decodability-based encoded packet component as described with reference to FIGS. 12 through 15.

Figure 19:
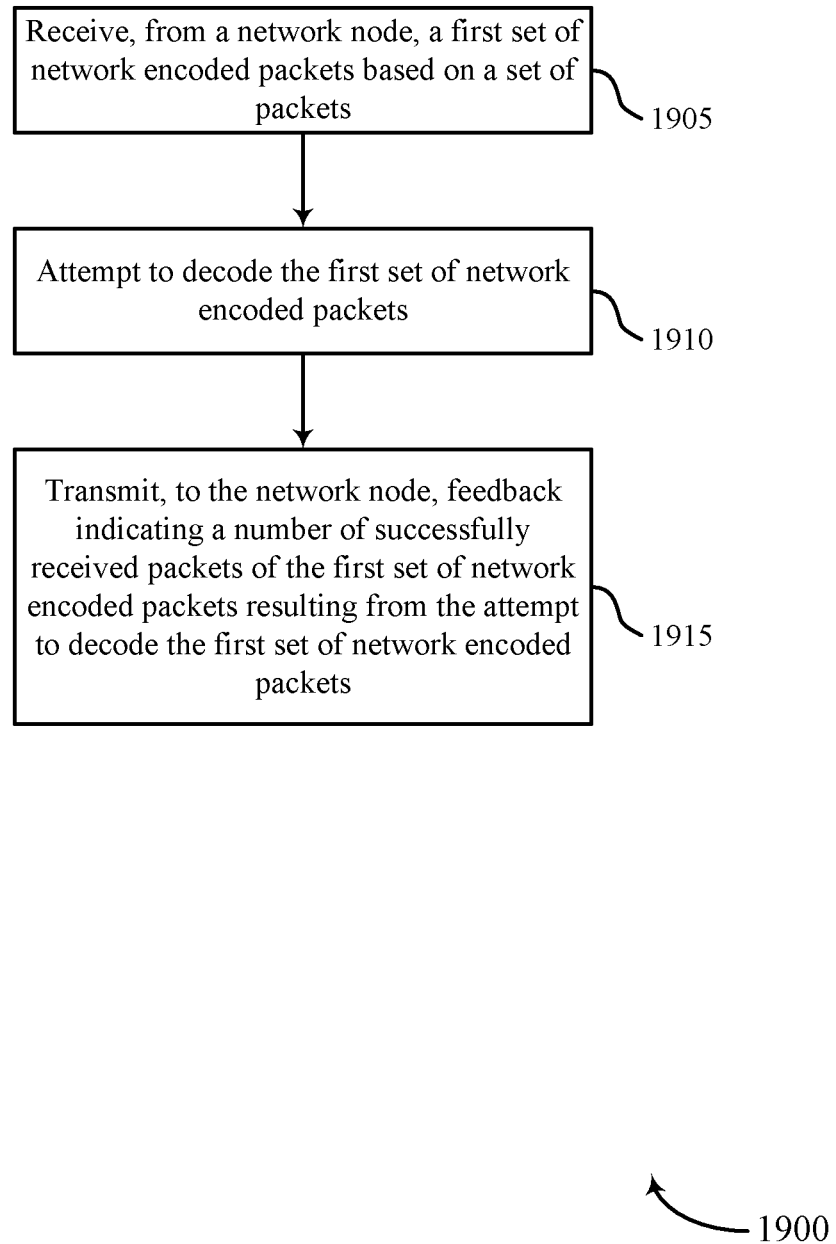

FIG. 19 shows a flowchart illustrating a method 1900 that supports feedback design for network coding termination in broadcasting in accordance with aspects of the present disclosure. The operations of method 1900 may be implemented by a UE 115 or its components as described herein. For example, the operations of method 1900 may be performed by a communications manager as described with reference to FIGS. 8 through 11. In some examples, a UE may execute a set of instructions to control the functional elements of the UE to perform the functions described below. Additionally or alternatively, a UE may perform aspects of the functions described below using special-purpose hardware.

At 1905, the UE may receive, from a network node, a first set of network encoded packets based on a set of packets. The operations of 1905 may be performed according to the methods described herein. In some examples, aspects of the operations of 1905 may be performed by a network encoded packet component as described with reference to FIGS. 8 through 11.

At 1910, the UE may attempt to decode the first set of network encoded packets. The operations of 1910 may be performed according to the methods described herein. In some examples, aspects of the operations of 1910 may be performed by an encoded packet decoder as described with reference to FIGS. 8 through 11.

At 1915, the UE may transmit, to the network node, feedback indicating a number of successfully received packets of the first set of network encoded packets resulting from the attempt to decode the first set of network encoded packets. The operations of 1915 may be performed according to the methods described herein. In some examples, aspects of the operations of 1915 may be performed by a feedback indication component as described with reference to FIGS. 8 through 11.

Figure 20:
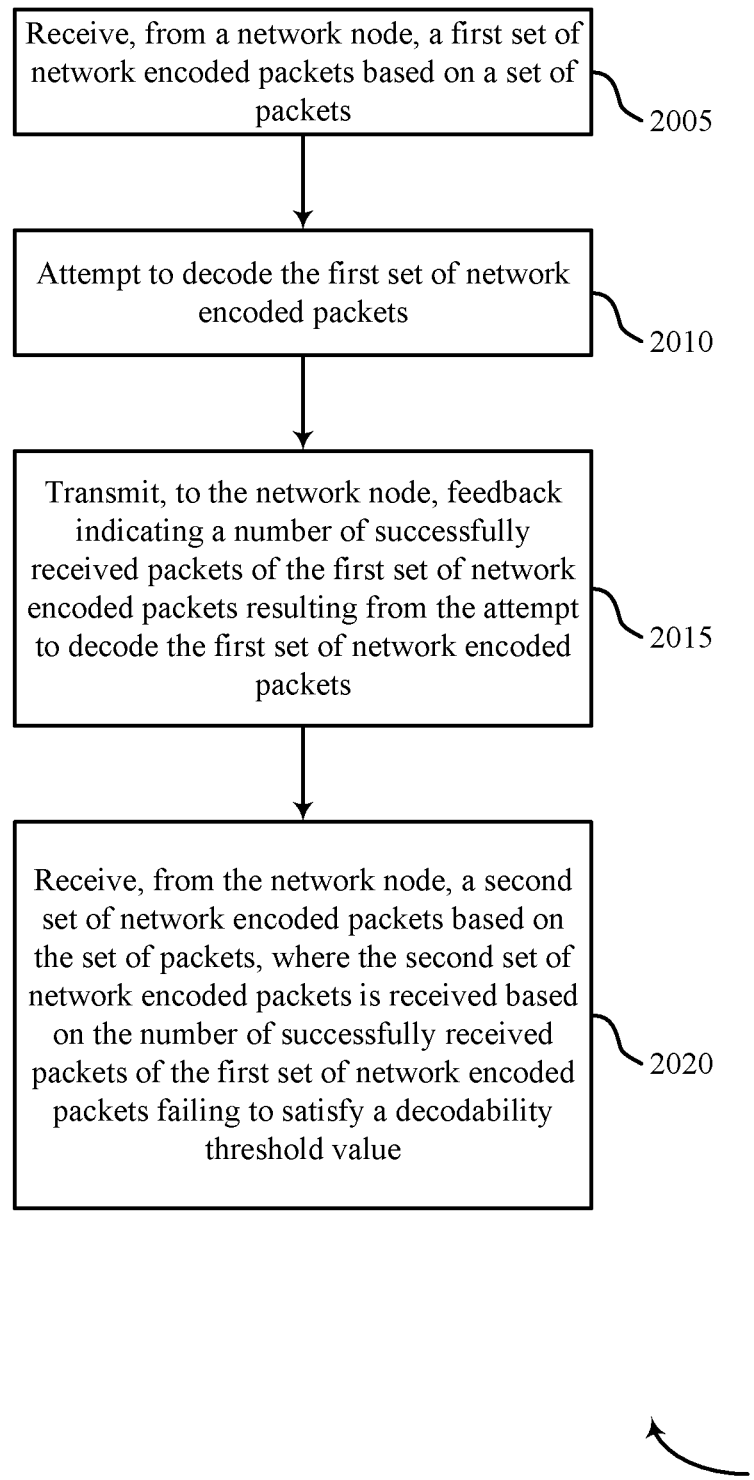

FIG. 20 shows a flowchart illustrating a method 2000 that supports feedback design for network coding termination in broadcasting in accordance with aspects of the present disclosure. The operations of method 2000 may be implemented by a UE 115 or its components as described herein. For example, the operations of method 2000 may be performed by a communications manager as described with reference to FIGS. 8 through 11. In some examples, a UE may execute a set of instructions to control the functional elements of the UE to perform the functions described below. Additionally or alternatively, a UE may perform aspects of the functions described below using special-purpose hardware.

At 2005, the UE may receive, from a network node, a first set of network encoded packets based on a set of packets. The operations of 2005 may be performed according to the methods described herein. In some examples, aspects of the operations of 2005 may be performed by a network encoded packet component as described with reference to FIGS. 8 through 11.

At 2010, the UE may attempt to decode the first set of network encoded packets. The operations of 2010 may be performed according to the methods described herein. In some examples, aspects of the operations of 2010 may be performed by an encoded packet decoder as described with reference to FIGS. 8 through 11.

At 2015, the UE may transmit, to the network node, feedback indicating a number of successfully received packets of the first set of network encoded packets resulting from the attempt to decode the first set of network encoded packets. The operations of 2015 may be performed according to the methods described herein. In some examples, aspects of the operations of 2015 may be performed by a feedback indication component as described with reference to FIGS. 8 through 11.

At 2020, the UE may receive, from the network node, a second set of network encoded packets based on the set of packets, where the second set of network encoded packets is received based on the number of successfully received packets of the first set of network encoded packets failing to satisfy a decodability threshold value. The operations of 2020 may be performed according to the methods described herein. In some examples, aspects of the operations of 2020 may be performed by a decodability-based encoded packet component as described with reference to FIGS. 8 through 11.

Figure 21:
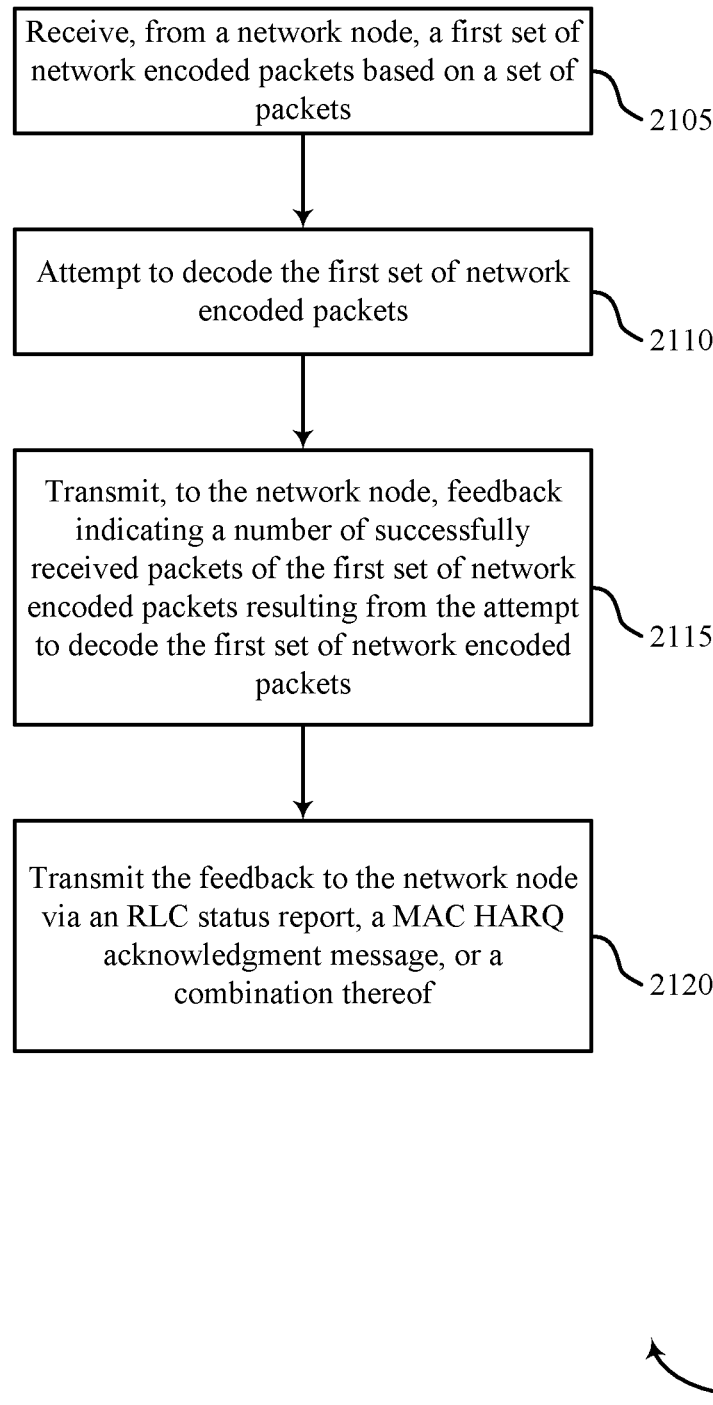

FIG. 21 shows a flowchart illustrating a method 2100 that supports feedback design for network coding termination in broadcasting in accordance with aspects of the present disclosure. The operations of method 2100 may be implemented by a UE 115 or its components as described herein. For example, the operations of method 2100 may be performed by a communications manager as described with reference to FIGS. 8 through 11. In some examples, a UE may execute a set of instructions to control the functional elements of the UE to perform the functions described below. Additionally or alternatively, a UE may perform aspects of the functions described below using special-purpose hardware.

At 2105, the UE may receive, from a network node, a first set of network encoded packets based on a set of packets. The operations of 2105 may be performed according to the methods described herein. In some examples, aspects of the operations of 2105 may be performed by a network encoded packet component as described with reference to FIGS. 8 through 11.

At 2110, the UE may attempt to decode the first set of network encoded packets. The operations of 2110 may be performed according to the methods described herein. In some examples, aspects of the operations of 2110 may be performed by an encoded packet decoder as described with reference to FIGS. 8 through 11.

At 2115, the UE may transmit, to the network node, feedback indicating a number of successfully received packets of the first set of network encoded packets resulting from the attempt to decode the first set of network encoded packets. The operations of 2115 may be performed according to the methods described herein. In some examples, aspects of the operations of 2115 may be performed by a feedback indication component as described with reference to FIGS. 8 through 11.

At 2120, the UE may transmit the feedback to the network node via a radio link control status report, a medium access control hybrid automatic repeat request acknowledgment message, or a combination thereof. The operations of 2120 may be performed according to the methods described herein. In some examples, aspects of the operations of 2120 may be performed by a feedback indication component as described with reference to FIGS. 8 through 11.

It should be noted that the methods described herein describe possible implementations, and that the operations and the steps may be rearranged or otherwise modified and that other implementations are possible. Further, aspects from two or more of the methods may be combined.

The following provides an overview of aspects of the present invention:

Aspect 1: A method for wireless communications at a network node, comprising: identifying, at the network node, a set of packets for broadcast to a plurality of user equipments (UEs); transmitting, to the plurality of UEs, a first set of network encoded packets based on the set of packets; receiving feedback from each of one or more of the plurality of UEs, the feedback indicating a number of successfully received packets of the first set of network encoded packets at each of the one or more UEs; determining that the number of successfully received packets of the first set of network encoded packets fails to satisfy a decodability threshold value for at least one of the one or more UEs; and transmitting, based at least in part on the determining, a second set of network encoded packets selected from the set of packets.

Aspect 2: The method of aspect 1, wherein receiving the feedback from each of the one or more of the plurality of UEs comprises: receiving, from each of the one or more of the plurality of UEs, a number of missed packets of the first set of network encoded packets, wherein the number of successfully received packets is indicated based at least in part on the number of missed packets.

Aspect 3: The method of aspect 1, wherein receiving the feedback from each of the one or more of the plurality of UEs comprises: receiving, from each of the one or more of the plurality of UEs, separate acknowledgment feedback indications for each packet in the first set of network encoded packets, wherein the number of successfully received packets is indicated based at least in part on the separate acknowledgment feedback indications.

Aspect 4: The method of any one of aspects 1 through 3, wherein transmitting the second set of network encoded packets comprises: transmitting the second set of network encoded packets to a subset of the plurality of UEs via respective unicast messages to each UE in the subset, wherein the subset of the plurality of UEs is determined based at least in part on the number of successfully received packets failing to satisfy the decodability threshold value for each UE in the subset.

Aspect 5: The method of aspect 4, further comprising: determining a number of UEs of the one or more of the plurality of UEs have successfully received the set of packets based at least in part on the feedback from each of the one or more of the plurality of UEs, wherein the second set of network encoded packets are transmitted via the unicast messages based at least in part on the number of UEs being less than a threshold.

Aspect 6: The method of any one of aspects 1 through 5, wherein transmitting the second set of network encoded packets comprises: transmitting the second set of network encoded packets to the plurality of UEs via a broadcast message.

Aspect 7: The method of any one of aspects 1 through 6, further comprising: storing the number of successfully received packets for each of the one or more UEs, wherein the determining the number of successfully received packets fails to satisfy the decodability threshold value is based at least in part on the storing the number of successfully received packets.

Aspect 8: The method of any one of aspects 1 through 7, further comprising: transmitting, to the plurality of UEs, one or more sets of network coding parameters to enable the plurality of UEs to decode a set of network encoded packets for the set of packets.

Aspect 9: The method of aspect 8, wherein the one or more sets of network coding parameters each comprise network coding algorithms, an encoding function, an encoding matrix, a maximum number of decoding iterations, the decodability threshold value, or a combination thereof.

Aspect 10: The method of any one of aspects 8 through 9, wherein transmitting the one or more sets of network coding parameters comprises: transmitting the one or more sets of network coding parameters to the plurality of UEs via a medium access control (MAC) control element, downlink control information, radio resource control signaling, or a combination thereof.

Aspect 11: The method of any one of aspects 8 through 10, further comprising: determining at least one UE of the plurality of UEs is unable to recover the set of packets using a first set of network coding parameters of the one or more sets of network coding parameters; and transmitting, to the at least one UE, an additional set of network coding parameters different than the first set of network coding parameters for the at least one UE to decode the set of network encoded packets to recover the set of packets.

Aspect 12: The method of aspect 11, further comprising: receiving, from the at least one UE, a request for a different set of network coding parameters than the first set of network coding parameters, wherein the determining the at least one UE is unable to recover the set of packets using the first set of network coding parameters is based at least in part on the request.

Aspect 13: The method of any one of aspects 11 through 12, wherein the additional set of network coding parameters is a second set of network coding parameters from the one or more sets of network coding parameters or a separate set of network coding parameters than the one or more sets of network coding parameters.

Aspect 14: The method of any one of aspects 1 through 13, wherein receiving the feedback comprises: receiving the feedback from each of one or more of the plurality of UEs via a radio link control status report, a medium access control hybrid automatic repeat request acknowledgment message, or a combination thereof.

Aspect 15: A method for wireless communications at a user equipment (UE), comprising: receiving, from a network node, a first set of network encoded packets based on a set of packets; attempting to decode the first set of network encoded packets; and transmitting, to the network node, feedback indicating a number of successfully received packets of the first set of network encoded packets resulting from the attempt to decode the first set of network encoded packets.

Aspect 16: The method of aspect 15, further comprising: receiving, from the network node, a second set of network encoded packets based on the set of packets, wherein the second set of network encoded packets is received based at least in part on the number of successfully received packets of the first set of network encoded packets failing to satisfy a decodability threshold value.

Aspect 17: The method of aspect 16, wherein receiving the second set of network encoded packets comprises: receiving the second set of network encoded packets via a broadcast message or a unicast message from the network node.

Aspect 18: The method of any one of aspects 15 through 17, wherein transmitting the feedback indicating the number of successfully received packets comprises: transmitting, to the network node, a number of missed packets of the first set of network encoded packets, wherein the number of successfully received packets is indicated based at least in part on the number of missed packets.

Aspect 19: The method of one of aspects 15 through 17, wherein transmitting the feedback indicating the number of successfully received packets comprises: transmitting, to the network node, separate acknowledgment feedback indications for each packet in the first set of network encoded packets, wherein the number of successfully received packets is indicated based at least in part on the separate acknowledgment feedback indications.

Aspect 20: The method of any one of aspects 15 through 19, further comprising: receiving, from the network node, one or more sets of network coding parameters to enable a plurality of UEs to decode a set of network encoded packets for the set of packets, the plurality of UEs including the UE.

Aspect e: The method of aspect 20, wherein the one or more sets of network coding parameters each comprise network coding algorithms, an encoding function, an encoding matrix, a maximum number of decoding iterations, the decodability threshold value, or a combination thereof.

Aspect 22: The method of any one of aspects 20 through 21, further comprising: determining to use a first set of network coding parameters from the one or more sets of network coding parameters for the attempting to decode the first set of network encoded packets.

Aspect 23: The method of aspect 22, further comprising: determining the first set of network coding parameters is insufficient for decoding the first set of network encoded packets to recover the set of packets; transmitting, to the network node, a request for a different set of network coding parameters based at least in part on the determining the first set of network coding parameters is insufficient; and receiving, from the network node, an additional set of network coding parameters for decoding a subsequent transmission of a set of encoded packets for the set of packets.

Aspect 24: The method of aspect 23, wherein the additional set of network coding parameters is a second set of network coding parameters from the one or more sets of network coding parameters or a separate set of network coding parameters than the one or more sets of network coding parameters.

Aspect 25: The method of any one of aspects 15 through 24, wherein transmitting the feedback comprises: transmitting the feedback to the network node via a radio link control status report, a medium access control hybrid automatic repeat request acknowledgment message, or a combination thereof.

Aspect 26: An apparatus for wireless communications at a network node comprising at least one means for performing a method of any one of aspects 1 through 14.

Aspect 27: An apparatus for wireless communications at a network node comprising a processor and memory coupled to the processor, the processor and memory configured to perform a method of any one of aspects 1 through 14.

Aspect 29: A non-transitory computer-readable medium storing code for wireless communications at a network node, the code comprising instructions executable by a processor to perform a method of any one of aspects 1 through 14.

Aspect 30: An apparatus for wireless communications at a user equipment (UE) comprising at least one means for performing a method of any one of aspects 15 through 25.

Aspect 31: An apparatus for wireless communications at a user equipment (UE) comprising a processor and memory coupled to the processor, the processor and memory configured to perform a method of any one of aspects 15 through 25.

Aspect 33: A non-transitory computer-readable medium storing code for wireless communications at a user equipment (UE), the code comprising instructions executable by a processor to perform a method of any one of aspects 15 through 25.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that may be accessed by a general-purpose or special-purpose computer. By way of example, and not limitation, non-transitory computer-readable media may include random-access memory (RAM), read-only memory (ROM), electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method for wireless communications at a network node, comprising:
    transmitting, to a plurality of user equipments (UEs) in accordance with a network coding termination scheme in which the network node terminates packet encoding once a decodability threshold is satisfied for each of the plurality of UEs, a first set of network encoded packets that are associated with a set of packets, wherein transmission of the first set of network encoded packets is part of a broadcast, to the plurality of UEs, of information from the set of packets;
    receiving feedback that indicates, for each of the plurality of UEs, a number of successfully received network encoded packets of the first set of network encoded packets; and
    transmitting one or more additional sets of network encoded packets associated with the set of packets, a first of the one or more additional sets of network encoded packets being transmitted based at least in part on the number of successfully received network encoded packets failing to satisfy the decodability threshold, and others of the one or more additional sets of network encoded packets being transmitted based at least in part on a failure to satisfy the decodability threshold for respective previous transmissions, wherein transmission of the one or more additional sets of network encoded packets continues until the decodability threshold is satisfied for each of the plurality of UEs.

2. The method of claim 1, wherein receiving the feedback for each of the plurality of UEs comprises:
    receiving, for each of the plurality of UEs, a number of missed network encoded packets of the first set of network encoded packets, wherein the number of successfully received network encoded packets is indicated based at least in part on the number of missed network encoded packets.

3. The method of claim 1, wherein receiving the feedback for each of the plurality of UEs comprises:
receiving, for each of the plurality of UEs, separate acknowledgment feedback indications for each network encoded packet in the first set of network encoded packets, wherein the number of successfully received network encoded packets is indicated based at least in part on the separate acknowledgment feedback indications.

4. The method of claim 1, wherein transmitting the one or more additional sets of network encoded packets comprises:
transmitting a second set of network encoded packets to a subset of the plurality of UEs via respective unicast messages to each UE in the subset, wherein the subset of the plurality of UEs is determined based at least in part on the number of successfully received network encoded packets failing to satisfy the decodability threshold for each UE in the subset.

5. The method of claim 4, further comprising:
determining that a number of UEs of the plurality of UEs have successfully received the first set of network encoded packets based at least in part on the feedback from each of the plurality of UEs, wherein the one or more additional sets of network encoded packets are transmitted via the respective unicast messages based at least in part on the number of UEs being less than a threshold.

6. The method of claim 1, wherein transmitting the one or more additional sets of network encoded packets comprises:
transmitting a second of the one or more additional sets of network encoded packets to the plurality of UEs via a broadcast message.

7. The method of claim 1, further comprising:
storing the number of successfully received network encoded packets for each of the plurality of UEs, wherein determining the number of successfully received network encoded packets fails to satisfy the decodability threshold is based at least in part on storing the number of successfully received network encoded packets.

8. The method of claim 1, further comprising:
transmitting, to the plurality of UEs, one or more sets of network coding parameters to enable the plurality of UEs to decode the first set of network encoded packets and the one or more additional sets of network encoded packets.

9. The method of claim 8, wherein the one or more sets of network coding parameters each comprise a decodability threshold and one or more of a network coding algorithm, an encoding function, an encoding matrix, or a maximum number of decoding iterations.

10. The method of claim 8, wherein transmitting the one or more sets of network coding parameters comprises:
transmitting the one or more sets of network coding parameters to the plurality of UEs via a medium access control (MAC) control element, downlink control information, radio resource control signaling, or any combination thereof.

11. The method of claim 8, further comprising:
determining that at least one UE of the plurality of UEs is unable to recover the information from the set of packets using a first set of network coding parameters of the one or more sets of network coding parameters; and
transmitting, to the at least one UE, an additional set of network coding parameters different than the first set of network coding parameters for the at least one UE to recover the information from the set of packets.

12. The method of claim 11, further comprising:
receiving, from the at least one UE, a request for a different set of network coding parameters than the first set of network coding parameters, wherein determining that the at least one UE is unable to recover the information from the set of packets using the first set of network coding parameters is based at least in part on the request.

13. The method of claim 11, wherein the additional set of network coding parameters is a second set of network coding parameters from the one or more sets of network coding parameters or a separate set of network coding parameters than the one or more sets of network coding parameters.

14. The method of claim 1, wherein receiving the feedback comprises:
receiving the feedback from each of the plurality of UEs via a radio link control status report, a medium access control hybrid automatic repeat request acknowledgment message, or any combination thereof.

15. A method for wireless communications at a user equipment (UE), comprising:
receiving, from a network node in accordance with a network coding termination scheme in which the network node terminates packet encoding once a decodability threshold is satisfied for a plurality of UEs including the UE, a first set of network encoded packets that are associated with a set of packets, wherein reception of the first set of network encoded packets is part of a broadcast, to the plurality of UEs, of information from the set of packets;
transmitting, to the network node, feedback indicating a number of successfully received network encoded packets of the first set of network encoded packets; and
receiving, from the network node, one or more additional sets of network encoded packets associated with the set of packets, a first of the one or more additional sets of network encoded packets being received based at least in part on the number of successfully received network encoded packets failing to satisfy the decodability threshold, and others of the one or more additional sets of network encoded packets being received based at least in part on a failure to satisfy the decodability threshold for respective previous transmissions, wherein reception of the one or more additional sets of network encoded packets continues until the decodability threshold is satisfied for each of the plurality of UEs.

16. The method of claim 15, wherein receiving the one or more additional sets of network encoded packets comprises:
receiving a second of the one or more additional sets of network encoded packets via a broadcast message or a unicast message from the network node.

17. The method of claim 15, wherein transmitting the feedback indicating the number of successfully received network encoded packets comprises:
transmitting, to the network node, a number of missed network encoded packets of the first set of network encoded packets, wherein the number of successfully received network encoded packets is indicated based at least in part on the number of missed network encoded packets.

18. The method of claim 15, wherein transmitting the feedback indicating the number of successfully received network encoded packets comprises:
transmitting, to the network node, separate acknowledgment feedback indications for each network encoded packet in the first set of network encoded packets, wherein the number of successfully received network encoded packets is indicated based at least in part on the separate acknowledgment feedback indications.

19. The method of claim 15, further comprising:
receiving, from the network node, one or more sets of network coding parameters to enable the UE to decode the first set of network encoded packets.

20. The method of claim 19, wherein the one or more sets of network coding parameters each comprise a decodability threshold and one or more of a network coding algorithm, an encoding function, an encoding matrix, or a maximum number of decoding iterations.

21. The method of claim 19, further comprising:
determining to use a first set of network coding parameters from the one or more sets of network coding parameters to decode the first set of network encoded packets.

22. The method of claim 21, further comprising:
transmitting, to the network node, a request for a different set of network coding parameters based at least in part on determining that the first set of network coding parameters is insufficient; and
receiving, from the network node, an additional set of network coding parameters for decoding a subsequent transmission of the one or more additional sets of network encoded packets.

23. The method of claim 22, wherein the additional set of network coding parameters is a second set of network coding parameters from the one or more sets of network coding parameters or a separate set of network coding parameters than the one or more sets of network coding parameters.

24. The method of claim 15, wherein transmitting the feedback comprises:
transmitting the feedback to the network node via a radio link control status report, a medium access control hybrid automatic repeat request acknowledgment message, or any combination thereof.

25. An apparatus for wireless communications, comprising:
a processor; and
a memory coupled with the processor, with instructions stored in the memory, the instructions being executable by the processor to cause the apparatus to:
transmit, to a plurality of user equipments (UEs) in accordance with a network coding termination scheme in which network packet encoding is terminated once a decodability threshold is satisfied for each of the plurality of UEs, a first set of network encoded packets that are associated with a set of packets, wherein transmission of the first set of network encoded packets is part of a broadcast, to the plurality of UEs, of information from the set of packets;
receive feedback that indicates, for each of the plurality of UEs, a number of successfully received network encoded packets of the first set of network encoded packets; and
transmit one or more additional sets of network encoded packets associated with the set of packets, a first of the one or more additional sets of network encoded packets being transmitted based at least in part on the number of successfully received network encoded packets failing to satisfy the decodability threshold, and others of the one or more additional sets of network encoded packets being transmitted based at least in part on a failure to satisfy the decodability threshold for respective previous transmissions, wherein transmission of the one or more additional sets of network encoded packets continues until the decodability threshold is satisfied for each of the plurality of UEs.

26. The apparatus of claim 25, wherein the instructions to receive the feedback for each of the plurality of UEs are executable by the processor to cause the apparatus to:
receive, for each of the plurality of UEs, a number of missed network encoded packets of the first set of network encoded packets, wherein the number of successfully received network encoded packets is indicated based at least in part on the number of missed network encoded packets.

27. The apparatus of claim 25, wherein the instructions to receive the feedback for each of the plurality of UEs are executable by the processor to cause the apparatus to:
receive, for each of the plurality of UEs, separate acknowledgment feedback indications for each network encoded packet in the first set of network encoded packets, wherein the number of successfully received network encoded packets is indicated based at least in part on the separate acknowledgment feedback indications.

28. An apparatus for wireless communications, comprising:
a processor; and
a memory coupled with the processor, with instructions stored in the memory, the instructions being executable by the processor to cause the apparatus to:
receive, from a network node in accordance with a network coding termination scheme in which the network node terminates packet encoding once a decodability threshold is satisfied for a plurality of UEs including the UE, a first set of network encoded packets that are associated with a set of packets, wherein reception of the first set of network encoded packets is part of a broadcast, to the plurality of UEs, of information from the set of packets;
transmit, to the network node, feedback indicating a number of successfully received network encoded packets of the first set of network encoded packets; and
receive, from the network node, one or more additional sets of network encoded packets associated with the set of packets, a first of the one or more additional sets of network encoded packets being received based at least in part on the number of successfully received network encoded packets failing to satisfy the decodability threshold, and others of the one or more additional sets of network encoded packets being received based at least in part on a failure to satisfy the decodability threshold for respective previous transmissions, wherein reception of the one or more additional sets of network encoded packets continues until the decodability threshold is satisfied for each of the plurality of UEs.

* * * * *